United States Patent
Okabe

(10) Patent No.: US 8,164,142 B2
(45) Date of Patent: Apr. 24, 2012

(54) SEMICONDUCTOR DEVICE AND METHOD OF MANUFACTURING SEMICONDUCTOR DEVICE

(75) Inventor: Kenichi Okabe, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/984,144

(22) Filed: Jan. 4, 2011

(65) Prior Publication Data

US 2011/0101428 A1     May 5, 2011

Related U.S. Application Data

(62) Division of application No. 12/171,676, filed on Jul. 11, 2008, now Pat. No. 7,892,933.

(30) Foreign Application Priority Data

Aug. 15, 2007   (JP) ................... 2007-211687

(51) Int. Cl.
    *H01L 21/02*   (2006.01)
(52) U.S. Cl. ........................ 257/344; 257/345
(58) Field of Classification Search ........... 257/336–345
    See application file for complete search history.

(56) References Cited

U.S. PATENT DOCUMENTS

| | | | |
|---|---|---|---|
| 6,534,348 B1 | 3/2003 | Moise et al. | |
| 6,642,115 B1 | 11/2003 | Cohen et al. | |
| 6,977,417 B2 | 12/2005 | Momiyama et al. | |
| 7,247,911 B2 | 7/2007 | Tsai et al. | |
| 7,442,593 B2 | 10/2008 | Nakajima et al. | |
| 7,892,933 B2 * | 2/2011 | Okabe | 438/306 |

FOREIGN PATENT DOCUMENTS

| | | |
|---|---|---|
| JP | 2-270335 A | 11/1990 |
| JP | 8-78674 A | 3/1996 |
| JP | 10-79506 A | 3/1998 |
| JP | 2002-329864 A | 11/2002 |
| JP | 2004-235603 A | 8/2004 |
| JP | 2005-294341 A | 10/2005 |
| JP | 2006-13284 A | 1/2006 |
| JP | 2006-93658 A | 4/2006 |

* cited by examiner

*Primary Examiner* — Richard A. Booth
(74) *Attorney, Agent, or Firm* — Westerman, Hattori, Daniels & Adrian, LLP

(57) ABSTRACT

According to an aspect of an embodiment, a semiconductor device has a semiconductor substrate, a gate insulating film on the semiconductor substrate, a gate electrode formed on the gate insulating film, an impurity diffusion region formed in an area of the semiconductor substrate adjacent to the gate electrode to a first depth to the semiconductor substrate, the impurity diffusion region containing impurity, an inert substance containing region formed in the area of the semiconductor substrate to a second depth deeper than the first depth, the inert substance containing region containing an inert substance, and a diffusion suppressing region formed in the area of the semiconductor substrate to a third depth deeper than the second depth, the diffusion suppressing region containing a diffusion suppressing substance suppressing diffusion of the impurity.

5 Claims, 12 Drawing Sheets

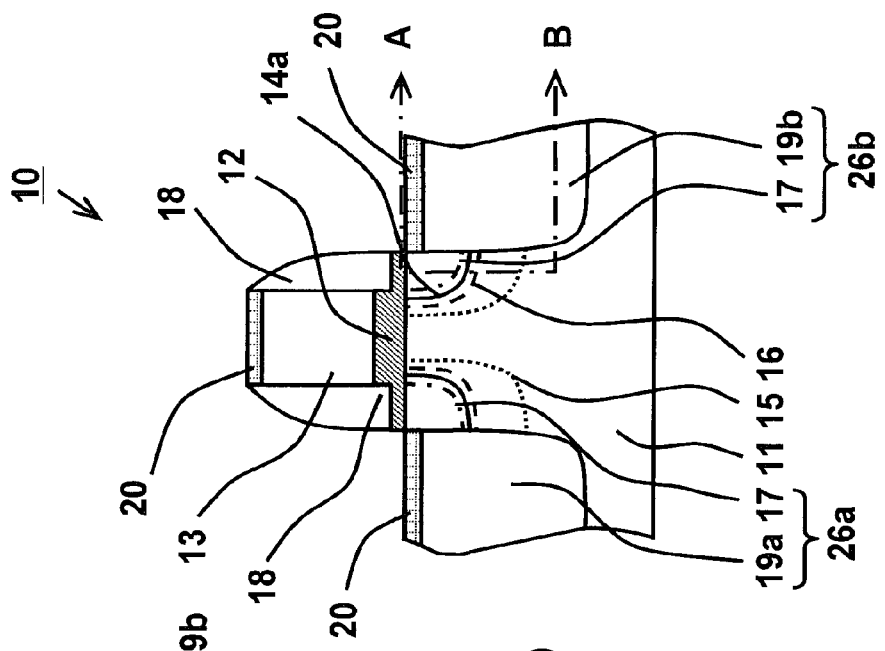
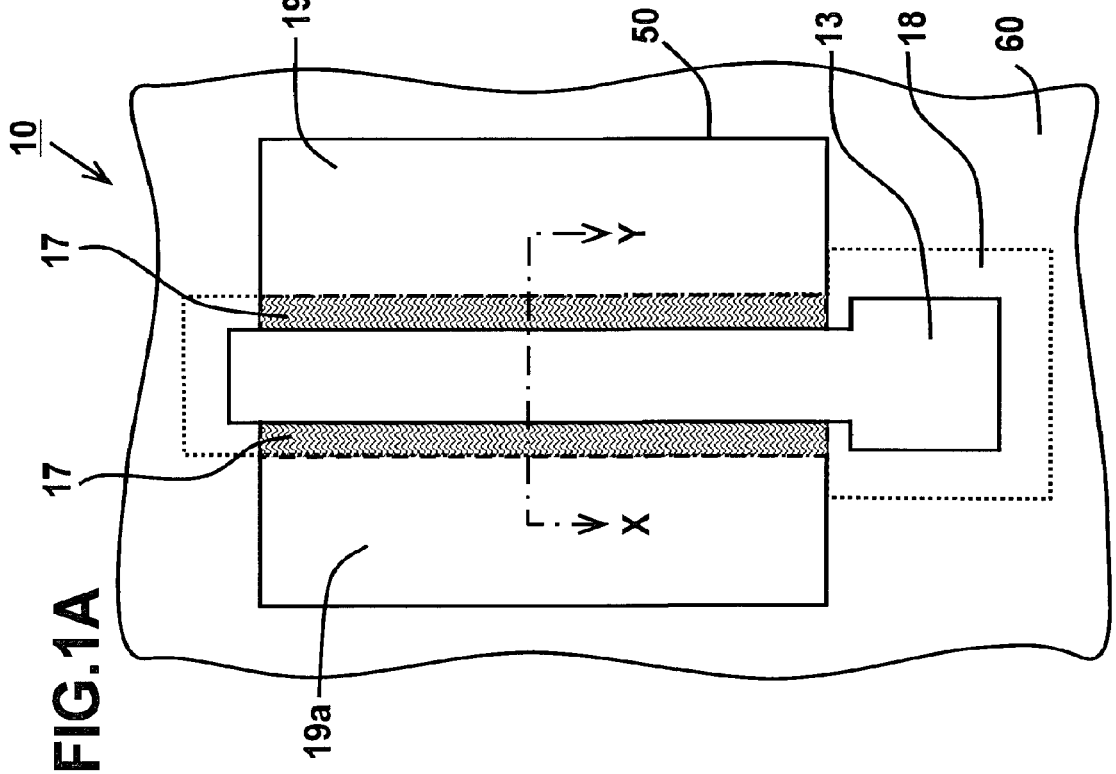
FIG.1A
FIG.1B

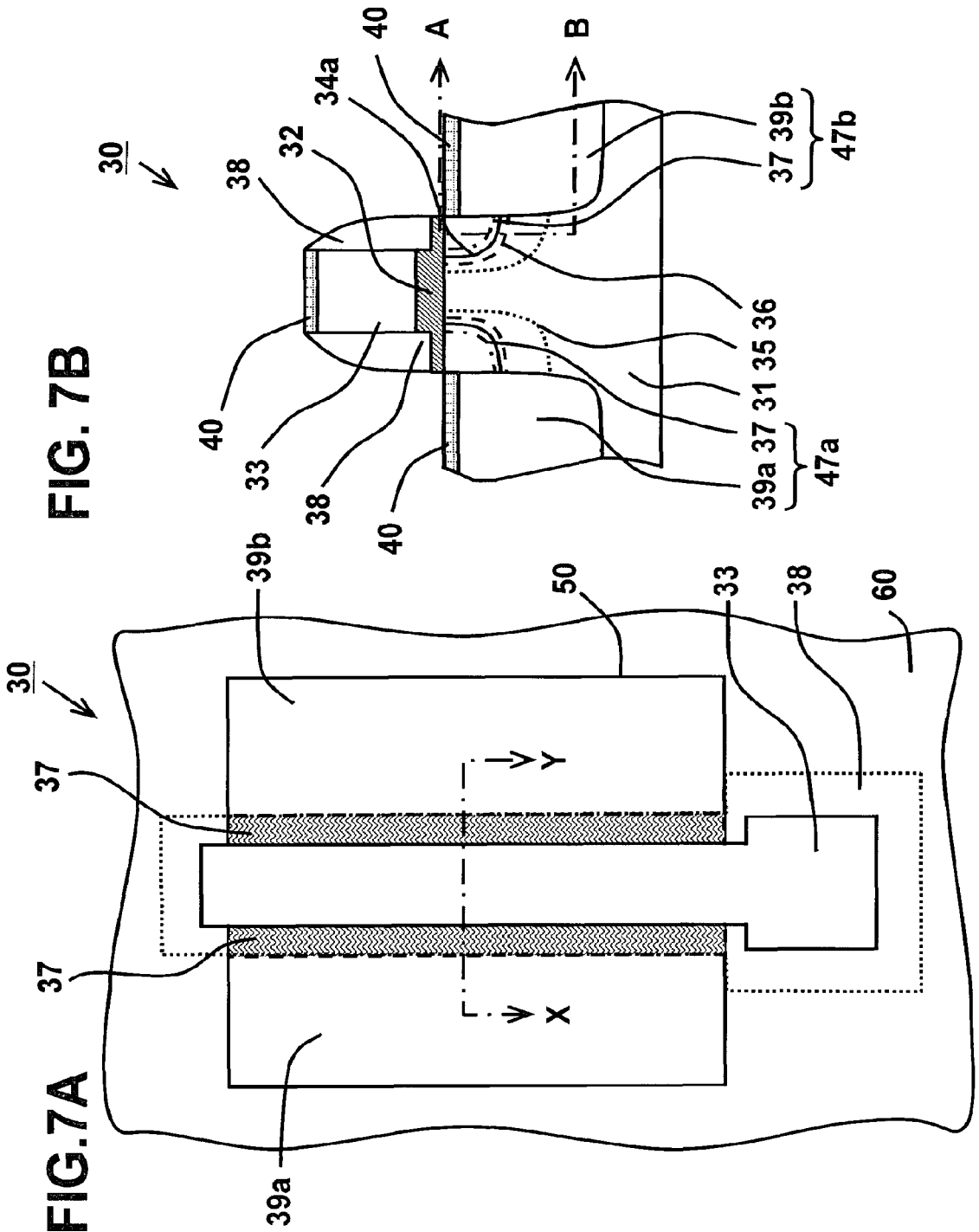

SEMICONDUCTOR DEVICE AND METHOD OF MANUFACTURING SEMICONDUCTOR DEVICE

CROSS-REFERENCE TO RELATED APPLICATIONS

This application is a divisional of U.S. application Ser. No. 12/171,676, filed on Jul. 11, 2008 which is based upon and claims the benefit of priority from the prior Japanese Patent Application No. 2007-211687, filed on Aug. 15, 2007, the entire contents of which are incorporated herein by reference.

BACKGROUND

This technique relates to a field-effect transistor that has an extension region and also to a method of manufacturing a field-effect transistor.

In recent years, as miniaturization of field-effect transistors proceeds, there is a problem that desired electrical characteristics cannot be obtained because of the short channel effect. In order to suppress the short channel effect, there has been employed a configuration in which an extension region is formed so that impurities are ion-implanted therein more shallowly than the source region or the drain region. However, just forming the extension region as in the existing art is insufficient to suppress the short channel effect due to miniaturization of field-effect transistors.

In order to suppress the short channel effect due to further miniaturization of field-effect transistors, currently, a manner, that is, a so-called pocket or halo, in which impurity concentration in the semiconductor substrate of a channel portion is locally increased or a manner in which an extension region is formed more shallowly than that of the existing art is used. When the extension region is formed more shallowly than that of the existing art, it is desirable not to merely reduce the energy used for implanting impurities but to obtain a steep distribution of diffused impurity concentration after heat treatment. This is because, when impurity concentration distribution is gentle, it results in suppressing the amount of impurities introduced to make the extension region be shallow. Therefore, the resistance of the extension region becomes high and, hence, it leads to a decrease in electric current driving ability of the field-effect transistors.

In order to make the impurity concentration distribution of the extension region be steep, time or temperature for annealing is reduced. However, because of accelerated diffusion due to damage after ion implantation, it is necessary to control diffusion of the above impurities to obtain a desired steepness. There has been proposed a technology that controls diffusion of the impurities, which is, for example, described in Japanese Laid-open Patent Publication No. 2004-235603. In the technology, a region in which an extension region is formed is amorphized at the same time in the process in which a pocket region is formed, and a diffusion suppressing substance that suppresses diffusion of impurities is ion-implanted into the interface between an amorphized region and a crystallized region.

SUMMARY

According to an aspect of an embodiment, a semiconductor device has a semiconductor substrate, a gate insulating film over the semiconductor substrate, a gate electrode formed over the gate insulating film, an impurity diffusion region formed in an area of the semiconductor substrate adjacent to the gate electrode to a first depth to the semiconductor substrate, the impurity diffusion region containing impurity, an inert substance containing region formed in the area of the semiconductor substrate to a second depth deeper than the first depth, the inert substance containing region containing an inert substance, and a diffusion suppressing region formed in the area of the semiconductor substrate to a third depth deeper than the second depth, the diffusion suppressing region containing a diffusion suppressing substance suppressing diffusion of the impurity.

BRIEF DESCRIPTION OF THE DRAWINGS

FIGS. 1A and 1B are views, each of which shows the configuration of an n-type. MIS transistor according to a first embodiment;

FIGS. 7A and 7B are views, each of which shows the configuration of a p-type MIS transistor according to a second embodiment;

DESCRIPTION OF THE PREFERRED EMBODIMENTS

Figure 2A:
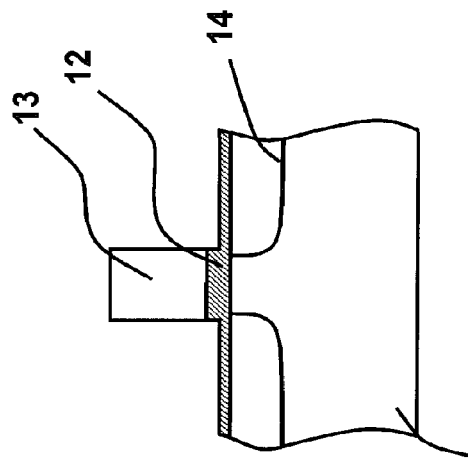
FIGS. 2A to 2D are cross-sectional views that show a method of manufacturing the n-type MIS transistor according to the first embodiment.

Hereinafter, a first embodiment and a second embodiment according to this technique will be described.

First Embodiment

In the first embodiment of this technique, FIGS. 1A to FIG. 6 are views that specifically illustrate the configuration of an n-type MIS transistor 10 and a method of manufacturing the n-type MIS transistor 10. Note that the Metal Insulator Semiconductor (MIS) transistor means a field-effect transistor. The configuration and manufacturing method of the n-type MIS transistor 10 according to the first embodiment are characterized in that the interface between an amorphous region 14 and a crystal is formed on the lower side with respect to an extension region 17, that is, at a second depth that is deeper than a first depth. Thus, as a thermal load that can generate diffusion is applied after the extension region 17 has been formed in the amorphous region 14, a diffusion suppressing substance segregates at the interface between the amorphous region 14 and the crystal. The segregation of a diffusion suppressing substance consumes point defects at the interface, so that diffusion of n-type impurities in the extension region 17 is suppressed. Because diffusion of n-type impurities in the extension region 17 is suppressed, it is possible to make the impurity concentration distribution in the extension region 17 be steep.

FIGS. 1A and 1B are views, each of which shows the configuration of the n-type MIS transistor 10 according to the first embodiment. FIG. 1A is a plan view of the n-type MIS transistor 10. FIG. 1B is a cross-sectional view that is taken along the line X-Y in FIG. 1A.

In FIG. 1A, a gate electrode is denoted by the reference numeral 13, the extension region is denoted by the reference numeral 17, a side wall is denoted by the reference numeral 18, a source region having a high impurity concentration is denoted by the reference numeral 19a, a drain region having a high impurity concentration is denoted by the reference numeral 19b, an active region is denoted by the reference numeral 50, and a device isolation region is denoted by the reference numeral 60.

As shown in FIG. 1A, the device isolation region 60 is provided around the n-type MIS transistor 10. The active region 50 is a rectangular region that is defined by the device isolation region 60. The gate electrode 13 is provided so that its rectangular pattern portion crosses over the middle portion of the active region 50. The side wall 18 is provided around the gate electrode 13. The extension regions 17 are provided in the active region 50 adjacent to the gate electrode 13 in a predetermined width. Note that, as will be shown in FIG. 18 later, an inert substance containing region 14a, a diffusion suppressing region 16 and the extension region 17 are substantially overlapped as viewed from the upper face. The source region 19a having a high impurity concentration and the drain region 19b having a high impurity concentration are provided in a region within the active region 50 except the gate electrode 13 and the extension regions 17 as viewed from the upper face.

In FIG. 1B, a p-type silicon substrate is denoted by the reference numeral 11, a gate insulating film is denoted by the reference numeral 12, the gate electrode is denoted by the reference numeral 13, the inert substance containing region is denoted by the reference numeral 14a, a pocket region is denoted by the reference numeral 15, the diffusion suppressing region is denoted by the reference numeral 16, the extension region is denoted by the reference numeral 17, the side wall is denoted by the reference numeral 18, the source region having a high impurity concentration is denoted by the reference numeral 19a, the drain region having a high impurity concentration is denoted by the reference numeral 19b, a silicide layer is denoted by the reference numeral 20, a source region is denoted by the reference numeral 26a, and a drain region is denoted by the reference numeral 26b. Note that, in FIG. 1B, the same reference numerals are assigned to the same configuration as the configuration described with reference to FIG. 1A.

The gate insulating film 12 is formed on the p-type silicon substrate 11. The gate insulating film 12 has a thickness of about 1 nm to 2 nm, for example.

The gate electrode 13 is formed above the p-type silicon substrate 11 through the gate insulating film 12. The gate electrode 13 has a height of about 100 nm, for example. The gate electrode 13 has a width of about 25 nm to 90 nm, for example. The gate electrode 13 may be formed of polysilicon.

The source region 26a and the drain region 26b are provided within the p-type silicon substrate 11. The extension regions 17 are respectively part of the source region 26a and part of the drain region 26b. The extension regions 17 each are regions into which impurities that impart an n conductivity type are ion-implanted. The extension regions 17 each are desirably formed from the long side of the rectangular pattern of the gate electrode 13 within a range of, for example, 80 nm and, inside the p-type silicon substrate 11, within a range from the surface thereof to a first depth, that is, for example, to a depth of 40 nm at the maximum (within a range in which impurity concentration is equal to or more than $1.0 \times 10^{18}$ $cm^{-3}$).

The width to which each extension region 17 is formed is dependent on the width to which the side wall 18 is formed on the p-type silicon substrate 11, which will be described later. This is because the extension regions 17, when the source region 19a having a high impurity concentration and the drain region 19b having a high impurity concentration are formed by ion-implanting impurities, are formed by masking ion implantation of impurities using the gate electrode 13 and the side wall 18. The extension regions 17 are provided to reduce the influence due to spreading of a depletion layer to the channel portion of the source region 26a and the drain region 26b to suppress the short channel effect of the n-type MIS transistor 10. Note that the channel portion in the n-type MIS transistor 10 is formed in the p-type silicon substrate 11 immediately below the gate electrode 13. That is, the channel portion is a region that is located between the source region 26a and the drain region 26b.

The inert substance containing region 14a is a region that contains an inert substance that is equal to or heavier than silicon. The inert substance in the present embodiment is desirably germanium. Note that the inert substance may be silicon, germanium, xenon, or argon. The inert substance containing region 14a is a region that is crystallized by performing thermal treatment on the amorphous region 14, which will be described later, in which silicon exists in an amorphous state.

The amorphous state generally means a state in which bonding of a silicon and another silicon is cleaved. However, in the present embodiment, there may be some bonding between a silicon and another silicon. The amorphous state may be achieved in such a manner that the crystallized state of the p-type silicon substrate 11 is broken by ion-implanting the inert substance.

The inert substance containing region 14a is formed within the p-type silicon substrate 11 and is arranged adjacent to the long side of the rectangular pattern of the gate electrode 13. The inert substance containing region 14a is provided so as to overlap each of the extension regions 17. Thus, each of the inert substance containing regions 14a is formed from the long side of the rectangular pattern portion of the gate electrode 13 within a range of 80 nm, and is formed to the second depth that is deeper than the first depth, which is the lower end of the extension region 17. Each inert substance containing region 14a is formed within a range from the surface of the p-type silicon substrate 11 to a depth of 50 nm at the maximum, which is deeper than the extension region 17 and which is the second depth that is deeper than the first depth.

The width to which each inert substance containing region 14a is formed is dependent on the width to which the side wall 18 is formed on the p-type silicon substrate 11, which will be described later. This is because the inert substance containing regions 14a, when the source region 19a having a high impurity concentration and the drain region 19b having a high impurity concentration are formed by ion implantation, are formed by masking ion implantation of impurities using the gate electrode 13 and the side wall 18.

Note that, as will be described later, when n-type ions are implanted into the source region 19a having a high impurity concentration and the drain region 19b having a high impurity concentration, the source region 19a having a high impurity concentration and the drain region 19b having a high impurity concentration also enter an amorphous state as in the case of the inert substance containing region 14a. However, each inert substance containing region 14a in the present embodiment means a region that is formed by ion-implanting an inert substance within the p-type silicon substrate 11 below the side wall 18.

Each of the diffusion suppressing regions 16 is arranged within the p-type silicon substrate 11 and is located adjacent to the long side of the rectangular pattern of the gate electrode 13. Each diffusion suppressing region is provided by ion-implanting a diffusion suppressing substance in order to suppress diffusion of impurities that will be ion-implanted into the corresponding extension region 17. The peak of concentration of the diffusion suppressing substance is formed to coincide with the interface of each amorphous region 14 or is formed to a third depth, which is deeper than the second depth and which is on the lower side with respect to the interface of each amorphous region 14. As shown in FIG. 1B, each diffusion suppressing region 16 is formed within the active region 50 except the gate electrode 13.

Each of the pocket regions 15 is arranged within the p-type silicon substrate 11 and is located adjacent to the long side of the rectangular pattern of the gate electrode 13. Each pocket region 15 is provided below the corresponding extension region 17. Each pocket region 15 is provided in order to suppress the punch-through effect between the source region 26a and the drain region 26b.

The maximum depth to which each pocket region 15 is formed is desirably within a range from the surface of the p-type silicon substrate 11 to, for example, 40 nm at the maximum. This is because the pocket regions 15, when the source region 19a having a high impurity concentration and the drain region 19b having a high impurity concentration are formed by ion implantation, are formed by masking ion implantation of impurities using the gate electrode 13 and the side wall 18.

The side wall 18 is formed on the side wall of the gate electrode 13. The side wall 18 may be formed using silicon oxide, which is an insulating material. The side wall 18 is desirably formed to have a thickness of, for example, 10 to 80 nm. This is because diffusion due to implantation energy of the extension and a thermal load applied in a manufacturing process is taken into consideration.

The source region 19a has a high impurity concentration and the drain region 19b having a high impurity concentration each are provided from the end portion at which the side wall 18 is positioned to a predetermined width on the p-type silicon substrate 11. As shown in FIG. 1A, the source region 19a having a high impurity concentration and the drain region 19b having a high impurity concentration are formed within the active region 50 except the gate electrode 13. The maximum depth to which the source region 19a having a high impurity concentration or the drain region 19b having a high impurity concentration is formed is desirably within a range from the surface of the p-type silicon substrate 11 to, for example, 100 nm.

The silicide layer 20 is provided on the surfaces of the gate electrode 13, the source region 19a having a high impurity concentration and the drain region 19b having a high impurity concentration. The silicide layer 20 is desirably formed to have a thickness of, for example, 5 nm to 30 nm. Note that, in the aspects of the embodiment, it is not essential to form the silicide layer 20.

FIG. 2A to FIG. 4 are views that illustrate a method of manufacturing the n-type MIS transistor 10 according to the first embodiment.

FIG. 2A is a view that illustrates a process in which the gate insulating film 12 and the gate electrode 13 are formed.

The gate insulating film 12 is formed on the p-type silicon substrate 11. The p-type silicon substrate 11 has a body of single crystal silicon. The p-type silicon substrate 11 has a p-type conductive impurity concentration of, for example, $1.0 \times 10^{16}$ cm$^{-3}$. The gate insulating film is formed of silicon nitride oxide (SiON), which is formed by, for example, CVD or a combination of thermal oxidation and thermal nitridation.

The gate electrode 13 is formed on the gate insulating film 12. The gate electrode 13 is formed so that a polysilicon film (not shown) is deposited on the gate insulating film 12 to a thickness of about 100 nm, for example, by means of CVD, or the like, and a resist pattern is formed by means of photolithography and, thereafter, a polysilicon film is patterned to be shaped into an electrode by means of anisotropic etching.

Figure 2B:
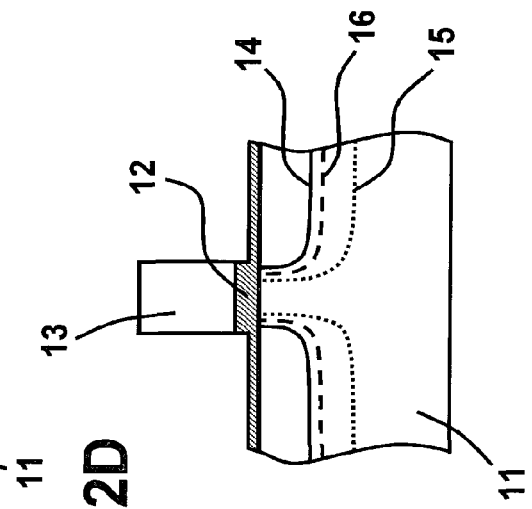

FIG. 2B is a view that illustrates a process in which the amorphous region 14 is formed in the p-type silicon substrate 11 to a fourth depth.

The amorphous region 14 is formed so that an inert substance is ion-implanted into the amorphous region 14 within the semiconductor substrate of the p-type silicon substrate 11 to the fourth depth using the gate electrode 13 as a mask. The inert substance may, for example, employ germanium. The condition of ion implantation of the inert substance is, for example, an acceleration energy of 5 keV to 30 keV and a dose amount of $5 \times 10^{13}$ cm$^2$ to $2 \times 10^{15}$/cm$^2$.

According to LSS (Landward, Scharff, Schiott) theory, when ions are implanted, the projected range of ions in a horizontal direction (channel direction) is presumably about half the projected range of ions in a vertical direction (ion-implantation direction). If the dose amount of phosphorus that is ion-implanted into the extension region 17, which will be described later, is set for $1 \times 10^{15}$/cm$^2$, and the ion-implanted phosphorus diffusibly distributed within a range of 15 nm at a concentration of $1 \times 10^{18}$/cm$^3$ in the vertical direction (ion-implantation direction), the average diffusion length in the horizontal direction (channel direction) is presumably about 7 nm. The amorphous region 14 is formed deeper than the diffusion length of the extension region 17 at the time when the final thermal treatment is applied, so that the amorphous region in the horizontal direction is basically wider than the length of the extension region 17 in the horizontal direction immediately after implantation. For example, when the condition of ion implantation of germanium is set so that the amorphous region 14 having a depth of 25 nm in the horizontal direction (ion-implantation direction) at an angle of 0 degrees, the amorphous region 14 will have a width of 12 nm in the horizontal direction (channel direction) and thereby includes the extension region 17.

In addition, the angle at which germanium is ion-implanted into the p-type silicon substrate 11 when the amorphous region 14 is formed may be set in a range from 0 degrees to 30 degrees. This is because, by setting the angle at which germanium is ion-implanted for 30 degrees at the maximum, the amorphous region 14 allows the extension region 17 to be formed on the further outer side in the channel direction.

Note that the method of forming the amorphous region 14 uses ion implantation herein; however, the amorphous region 14 may be formed by means of plasma doping, or the like. The element used for forming the amorphous region 14 may employ silicon, xenon, or argon, other than germanium.

Figure 2C:
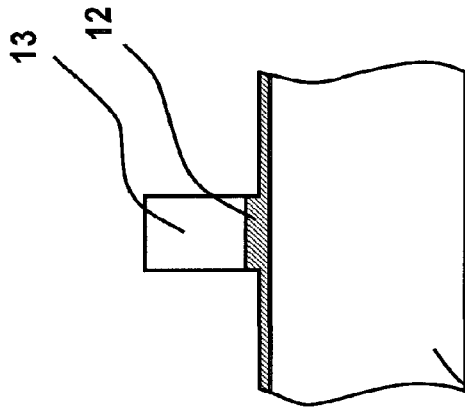

FIG. 2C is a view that illustrates a process in which the pocket region 15 is formed.

Each pocket region 15 is formed so that p-type conductive impurities are obliquely ion-implanted into the pocket region 15 of the p-type silicon substrate 11 using the gate electrode 13 as a mask. The oblique ion implantation is desirably performed at an angle of, for example, 0 degrees to 45 degrees, with respect to the normal of the semiconductor substrate, as indicated by the arrow 15a. This is because, by setting the angle of oblique ion implantation for 45 degrees at the maximum, the pocket region 15 will be formed on the outer side of the amorphous region 14 in the channel direction.

The p-type conductive impurities may, for example, employ indium. The condition of oblique ion implantation is an acceleration energy of 30 keV to 100 keV and a dose amount of $1 \times 10^{12}/cm^2$ to $2 \times 10^{13}/cm^2$ per one direction.

Note that the p-type conductive impurities that form the pocket region 15 may use boron. The condition of boron implantation is an acceleration energy of 3 keV to 15 keV and a dose amount of $1 \times 10^{12}/cm^2$ to $2 \times 10^{13}/cm^2$.

Figure 2D:
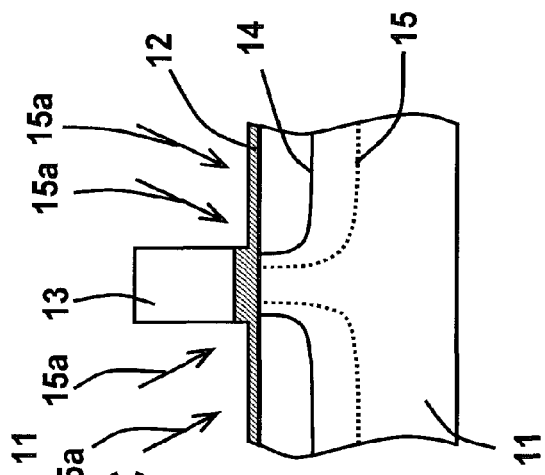

FIG. 2D is a view that illustrates a process in which the diffusion suppressing region 16 that suppresses diffusion of impurities is formed within the p-type silicon substrate 11 to a fifth depth that is deeper than the fourth depth.

Each diffusion suppressing region 16 is formed in such a manner that the p-type silicon substrate 11 is ion-implanted to have a peak of concentration of a diffusion suppressing substance at the interface of the amorphous region 14 using the gate electrode 13 as a mask. The diffusion suppressing substance desirably employs carbon. The condition of ion implantation of the diffusion suppressing substance is an acceleration energy of 2 keV to 15 keV and a dose amount of $5 \times 10^{13}/cm^2$ to $2 \times 10^{15}/cm^2$.

Note that the angle at which ions of the diffusion suppressing substance are implanted into the p-type silicon substrate 11 may be set within a range of 0 degrees to 30 degrees. This is because, by setting the angle at which ions of the diffusion suppressing substance are implanted for 30 degrees at the maximum, the diffusion suppressing region 16 is formed to the lower side of the extension region 17, that is, the fifth depth that is deeper than the fourth depth. In addition, carbon used as the diffusion suppressing substance may employ not only a simple substance but also a cluster. In addition, the diffusion suppressing substance may use nitrogen or fluorine in place of carbon.

Figure 3A:
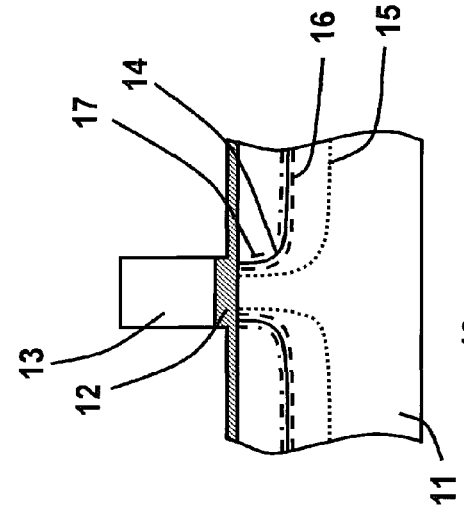
FIGS. 3A to 3D are cross-sectional views that show the method of manufacturing the n-type MIS transistor according to the first embodiment.

FIG. 3A is a view that illustrates a process in which the extension regions 17 are formed within the p-type silicon substrate 11 to a sixth depth that is deeper than the fourth depth.

Each extension region 17 is part of the source region 26a or part of the drain region 26b. Each extension region is formed so that impurities that impart an n conductivity type to the p-type silicon substrate 11 are ion-implanted more shallowly than the amorphous region 14, that is, to the sixth depth that is shallower than the fourth depth. Furthermore, the extension region 17 is formed to be shallower than the amorphous region 14 that was present before a thermal load is applied even when the portion that was the amorphous region 14 disappears by applying a maximally high-temperature thermal load.

The extension region 17 is formed in such a manner that ions are implanted into the extension region 17 of the p-type silicon substrate 11 using the gate electrode 13 as a mask. The n-type conductive impurities may, for example, use phosphorus. The condition of ion implantation of phosphorus in the extension region 17 is an acceleration energy of 0.5 keV to 5 keV and a dose amount of $1 \times 10^{14}/cm^2$ to $3 \times 10^{15}/cm^2$. In addition, phosphorus used for forming the extension region 17 may use molecular ion.

The extension region 17 is formed within each of the amorphous region 14, so that channeling due to ion implantation of phosphorus is suppressed. Because channeling due to ion implantation of phosphorus is suppressed, impurity concentration distribution, when ions of impurities are implanted into the extension region 17, may be formed to be narrow.

Note that the angle at which ions of phosphorus are implanted into the p-type silicon substrate 11 may be set within a range of 0 degrees to 30 degrees. By setting the angle at which ions of phosphorus are implanted for 30 degrees at the maximum, the amount of diffusion in the horizontal direction may be easily controlled. At the same time, the angle at which ions of germanium are implanted to form the amorphous region 14, the angle at which ions of boron are implanted to form the pocket region 15 or the angle at which ions of carbon are implanted to form the diffusion suppressing region 16 may be selected. This is because the extension region 17 is sufficiently shallow and therefore is formed sufficiently inside the amorphous region 14 even with a large angle.

Note that the n-type conductive impurities that form the extension region 17 may use arsenic or antimony. The condition of implantation of arsenic is an acceleration energy of 0.5 keV to 5 keV and a dose amount of $1.0 \times 10^{14}/cm^2$ to $3.0 \times 10^{15}/cm^2$. In addition, arsenic or antimony used for forming the extension region 17 may employ molecular ion.

Figure 3B:
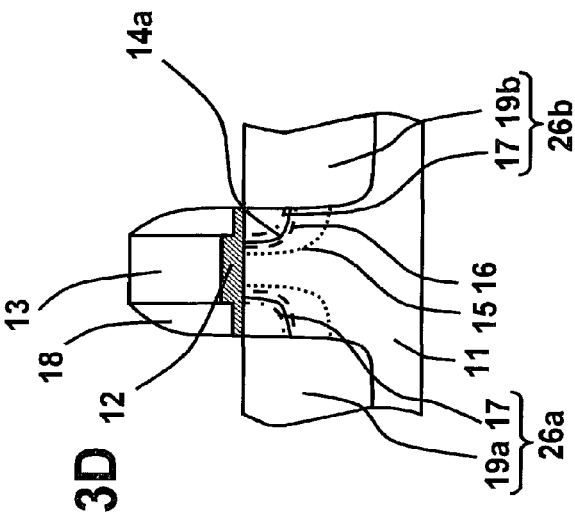

FIG. 3B is a view that illustrates a process in which the p-type silicon substrate 11 is performed with thermal treatment so that a diffusion suppressing substance segregates at the interface of the amorphous region 14. The thermal treatment process is performed to activate impurities of the pocket region 15 and impurities of the extension region 17.

The condition used in the thermal treatment process is desirably performed by means of RTA process (Rapid Thermal Annealing) for almost 0 seconds, except time to increase or decrease temperature, at a temperature of 900° C. to 1025° C. (it may be 10 seconds or below at a temperature of 900° C. to 1100° C.). The thermal treatment process is, for example, performed in an inert atmosphere, such as nitrogen. Note that the thermal treatment process may be performed by means of flash lamp or laser annealing.

Owing to the thermal treatment process, concentration distribution of carbon, which is a diffusion suppressing substance, changes from a state immediately after implantation. First, owing to the thermal treatment process, carbon, which is a diffusion suppressing substance, having a peak of concentration at the interface of the amorphous region 14, segregates at residual defects (EOR: End of Range) that are generated when the crystal of the amorphous region 14 grows. At this time, when the amorphous region 14 recovers but a thermal load is insufficient to generate segregation of the diffusion suppressing substance, segregation occurs at the time when a maximally high-temperature heat is applied in the final manufacturing process.

Owing to the carbon that enters the crystal defects of the p-type silicon substrate 11 at the interface of the amorphous region 14, aggregation of point defects also occurs at the same time. Thus, it becomes a stable state in terms of energy as a whole system and, hence, diffusion hardly occurs in the thermal treatment process. As a result, the carbon, which is a diffusion suppressing substance, segregates at the interface of the amorphous region 14.

The phosphorus that is ion-implanted into the extension region 17 segregates at the interface of the amorphous region 14 to thereby facilitate consumption of point defects that cause an increase in rate of diffusion, so that diffusion is suppressed. As a result, the carbon which is a diffusion suppressing substance forms steep distribution in the original amorphous region 14.

Note that, because the amorphous region 14 is crystallized through the present thermal treatment process, the interface between the amorphous region 14 and the p-type silicon substrate 11 disappears. Note that the original amorphous region 14 becomes an inert substance containing region 14a shown in FIG. 1B.

Figure 3C:
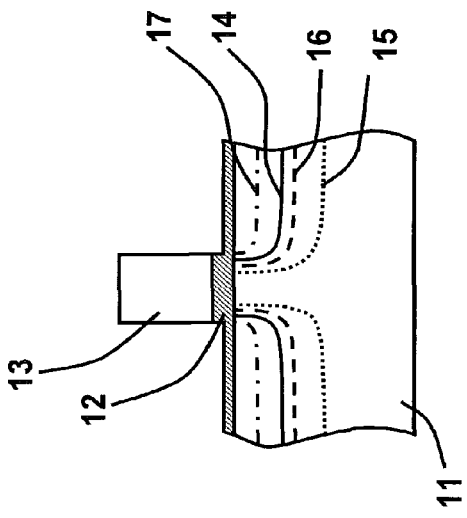

FIG. 3C is a view that illustrates a process in which the side wall 18 is formed. The side wall 18 is, for example, formed of silicon oxide.

First, a silicon oxide layer, which is formed of an insulating material, is, for example, formed in a length of about 10 nm to 80 nm by means of CVD so as to cover the gate electrode 13. Specifically, a method of forming the silicon oxide layer may employ a method in which, by means of low-pressure CVD, for example, tetraethoxysilane (TEOS) and $O_2$ as source gas are reacted under the semiconductor substrate temperature of 400° C. to 700° C. The reason why the semiconductor substrate temperature is set to a range from 400° C. to 700° C. is to prevent abnormal diffusion of phosphorus that is implanted into the extension region 17.

Next, the side wall 18 is formed over the entire face of the p-type silicon substrate 11 by performing anisotropic etching on the silicon oxide film. The etching of the silicon oxide film 14c may employ $C_4F_8/Ar/O_2$ gas that contain $C_4F_8$, which is a fluorine-based gas. Thus, the side wall 18 is formed on the side wall of the gate electrode 13 using an insulating material.

Figure 3D:
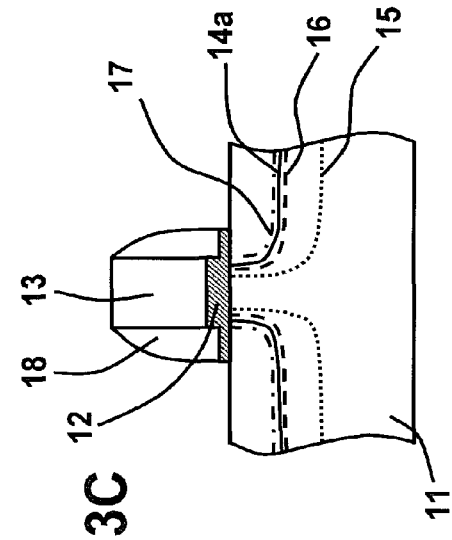

FIG. 3D is a view that illustrates a process in which the source region 19a having a high impurity concentration and the drain region 19b having a high impurity concentration are formed.

As shown in FIG. 3D, the source region 19a having a high impurity concentration and the drain region 19b having a high impurity concentration are respectively formed in such a manner that ions of n-type conductive impurities are implanted into the source region 19a having a high impurity concentration and the drain region 19b having a high impurity concentration of the p-type silicon substrate 11 using the gate electrode 13 and the side wall 18 as a mask. The n-type conductive impurities may, for example, use phosphorus. The condition of ion implantation of phosphorus in the source region 19a having a high impurity concentration and the drain region 19b having a high impurity concentration is an acceleration energy of 3.0 keV to 20.0 keV and a dose amount of $2.0 \times 10^{15}/cm^2$ to $1.0 \times 10^{16}/cm^2$. In addition, the n-type conductive impurities may use arsenic. In addition, the n-type conductive impurities may use molecular ions of phosphorus or arsenic.

After that, various ion-implanted impurities may be activated by means of annealing for about 10 seconds at a temperature of 1000° C.

Figure 4:
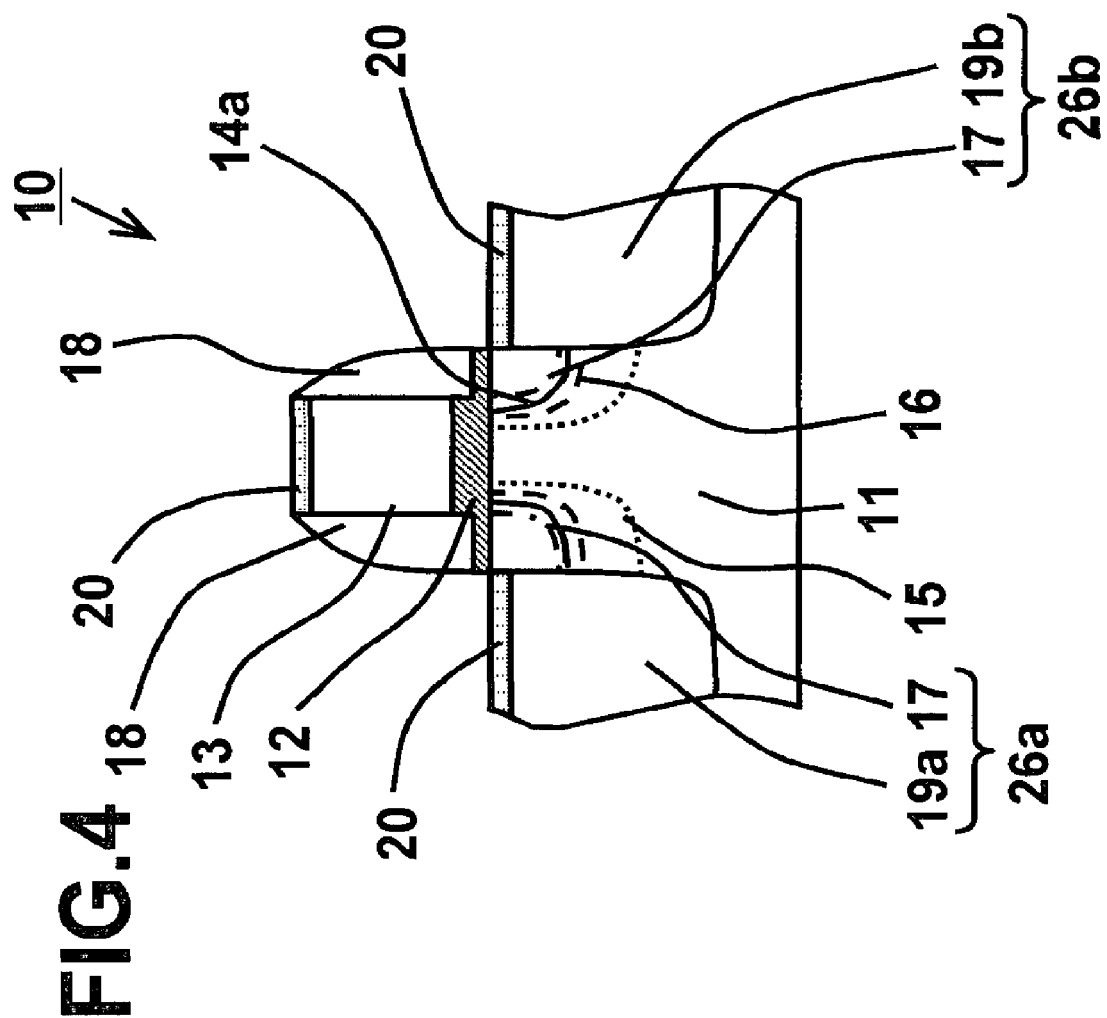
FIG. 4 is a cross-sectional view that shows the method of manufacturing the n-type MIS transistor according to the first embodiment.

FIG. 4 is a view that illustrates a process in which the silicide layer 20 is formed.

A metal that forms the silicide layer 20 is deposited on the surfaces of the gate electrode 13, the source region 19a and the drain region 19b. In the present embodiment, the metal that forms silicide is, for example, cobalt. The deposition of cobalt on the surfaces of the gate electrode 13, the source region 19a and the drain region 19b may be performed, for example, by sputtering by which a DC bias of about 250 W is applied using a cobalt target. The cobalt is desirably deposited to have a thickness of about 3 nm to 8 nm, for example. The primary silicidation reaction of cobalt on the surfaces of the gate electrode 13, the source region 19a and the drain region 19b may be performed in such a manner that low-temperature annealing is performed in the nitrogen atmosphere, for example, for 30 seconds at a temperature of about 500° C. After that, the unreacted cobalt film is removed, for example, by using a mixed solution of ammonia, hydrogen peroxide and water ($NH_3.H_2O_2.H_2O$) or a mixed solution of peroxomonosulfuric acid and hydrogen peroxide ($H_2SO_5.H_2O_2$) Note that the unreacted cobalt film may be removed by using a mixture of the mixed solution of ammonia, hydrogen peroxide and water ($NH_3.H_2O_2.H_2O$) and the mixed solution of peroxomonosulfuric acid and hydrogen peroxide ($H_2SO_5.H_2O_2$). Next, secondary silicidation on the surfaces of the gate electrode 13 and the p-type silicon substrate 11 may be performed in such a manner that high-temperature annealing of about 700° C., for example, is performed in the nitrogen ($N_2$) atmosphere for about 30 seconds.

In this manner, the silicide layer 20 is formed on the surfaces of the gate electrode 13, the source region 19a having a high impurity concentration and the drain region 19b having a high impurity concentration. In addition, after the cobalt (Co) film has been formed, a titanium film or a titanium nitride (TiN) film may be formed as a protective film on the silicide layer 20. In this case, the silicide layer 20 has a thickness of 5 nm to 30 nm. Note that, in the aspects of the embodiment, it is not essential to form the silicide layer 20.

Then, the n-type MIS transistor 10 is completed through processes, such as formation of an interlayer insulating film (not shown), formation of a contact hole (not shown), and formation of wiring (not shown).

Note that, in the present embodiment, the case in which, after the gate electrode has been formed, a pair of impurity diffusion regions, which serve as the source region and the drain region, are formed is exemplified. However, it may be conceivable that the order of the above formation may be modified where appropriate.

The present embodiment exemplifies the case in which the processes proceed in the order of the process of ion implantation of an inert substance for forming the amorphous region 14, the process of ion implantation for forming the pocket region 15, the process of ion implantation of carbon, which serves as a diffusion suppressing substance, and the process of forming the extension region 17; however, the order of these processes may be selected.

However, depending on the order of these processes, concentration distribution of ion implantation of the pocket region 15 and the extension region 17 is influenced because of amorphization due to formation of the amorphous region 14, so that an optimum design for them is necessary.

Figure 5A:
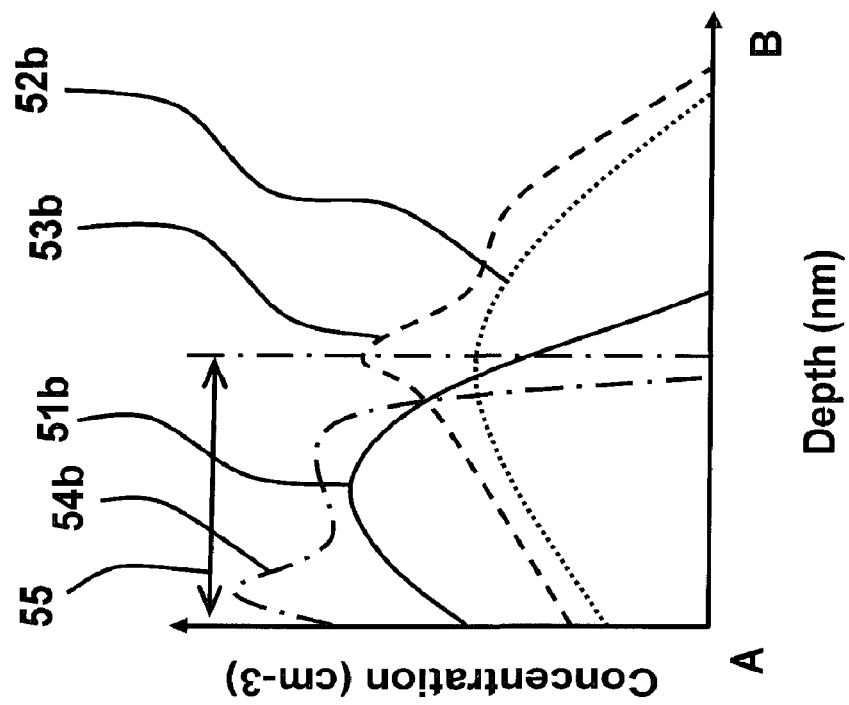
FIGS. 5A and 5B are schematic views, each of which shows the concentration distribution of each ion implantation according to the n-type MIS transistor of the first embodiment.
Figure 5B:
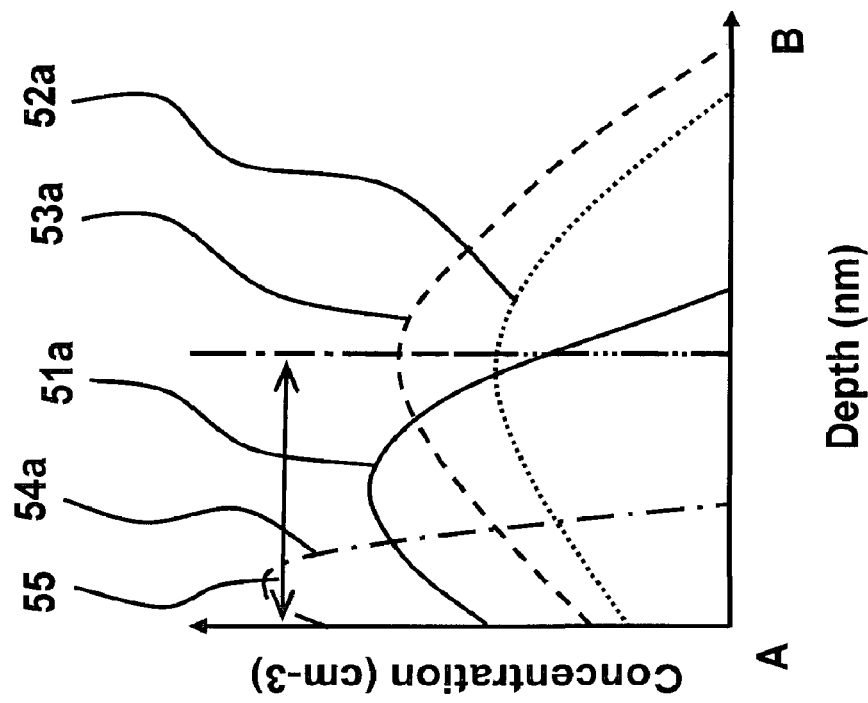

FIG. 5A and FIG. 5B are schematic views, each of which shows the concentration distribution of each ion implantation according to the n-type MIS transistor 10 of the first embodiment. The ordinate axis of each of FIG. 5A and FIG. 5B represents a concentration ($cm^{-3}$) of each implanted substance. The abscissa axis of each of FIG. 5A and FIG. 5B represents a depth (nm) from the surface of the p-type silicon substrate 11.

FIG. 5A is a view that illustrates the concentration distribution of each ion implantation in the cross-section, taken along the line A-B in FIG. 1B, before the p-type silicon substrate 11 is performed with thermal treatment so that the diffusion suppressing substance segregates at the interface of the amorphous region 14. The reference numeral 51a denotes the concentration distribution of germanium contained in the amorphous region 14. The reference numeral 52a denotes the concentration distribution of indium contained in the pocket region 15. The reference numeral 53a denotes the concentration distribution of carbon contained in the diffusion suppressing region 16. The reference numeral 54a denotes the concentration distribution of phosphorus contained in the extension region 17. The arrow 55 denotes a depth from the p-type silicon substrate 11 to which crystallinity of the p-type silicon substrate 11 has broken when germanium is ion-implanted into the amorphous region 14.

As shown in FIG. 5A, the concentration peak 52a of indium in the pocket region 15 and the concentration peak of carbon in the diffusion suppressing region 16 are positioned at the interface between the amorphous region 14 and the crystal in the p-type silicon substrate 11.

FIG. 5B is a view that illustrates the concentration distribution of each ion implantation in the cross-section, taken along the line A-B in FIG. 1B, after the p-type silicon substrate 11 has been performed with thermal treatment so that the diffusion suppressing substance segregates at the interface of the amorphous region 14. The reference numeral 51b denotes the concentration distribution of germanium contained in the amorphous region 14. The reference numeral 52b denotes the concentration distribution of indium contained in the pocket region 15. The reference numeral 53b denotes the concentration distribution of carbon contained in the diffusion suppressing region 16. The reference numeral 54b denotes the concentration distribution of phosphorus contained in the extension region 17. The arrow 55 denotes a depth from the p-type silicon substrate 11 to which crystallinity of the p-type silicon substrate 11 has broken when germanium is ion-implanted into the amorphous region 14.

As shown in FIG. 5B, it appears that the concentration peak of carbon in the diffusion suppressing region 16 is steep at the interface between the amorphous region 14 and the crystal in the p-type silicon substrate 11. Next, it appears that the concentration distribution of phosphorus contained in the extension region 17 is steep in the amorphous region 14.

Here, the concentration distribution according to SIMS (Secondary Ion Mass Spectrometry) of each implantation described above in the present embodiment will be described.

Figure 6:
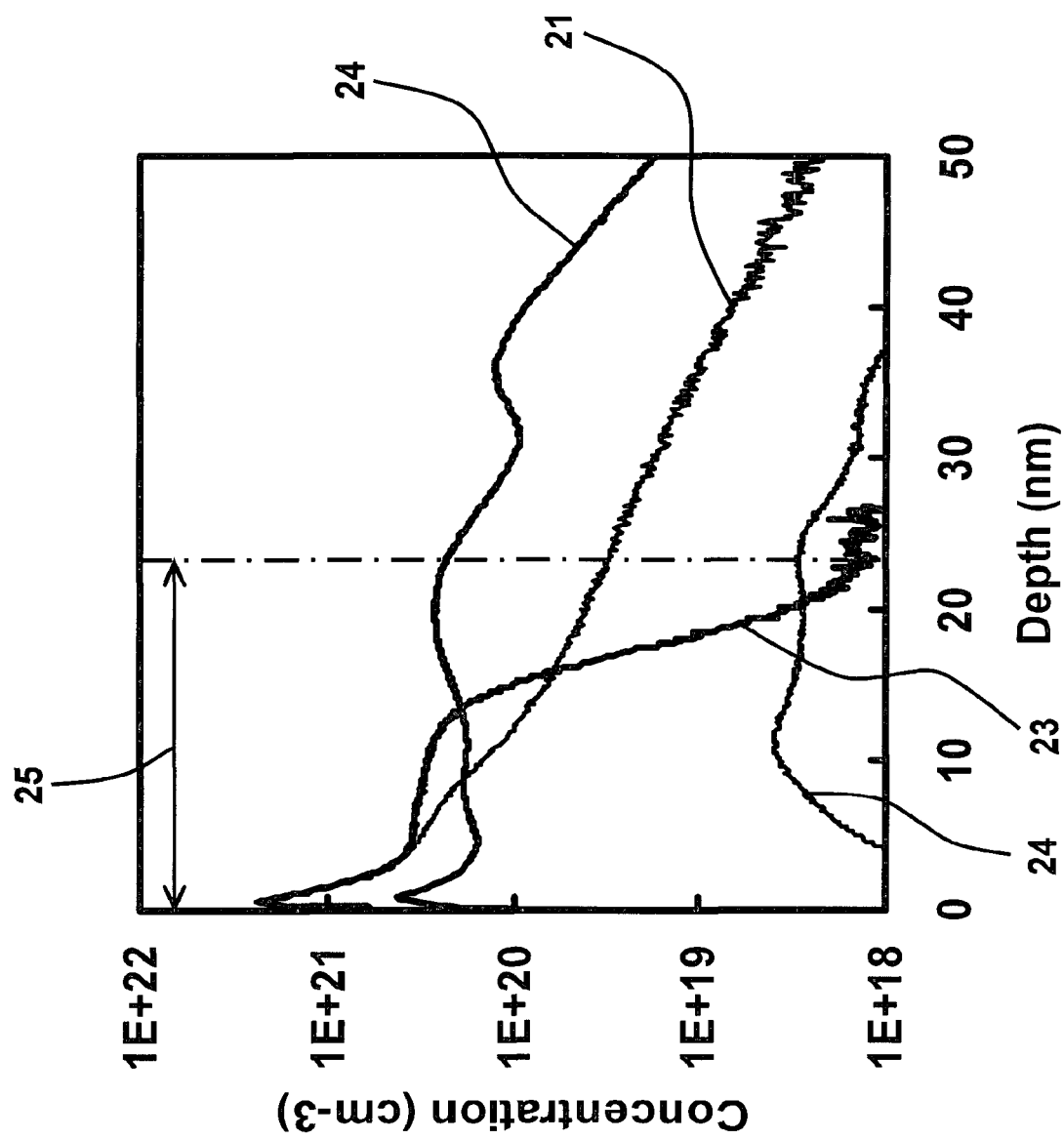
FIG. 6 is a view that shows the concentration distribution of each ion implantation, measured by SIMS, according to the n-type MIS transistor of the first embodiment.

FIG. 6 is a characteristic view that shows the concentration distribution according to SIMS of each implantation described in the present embodiment. The ordinate axis of FIG. 6 represents a concentration ($cm^{-3}$) of each implanted substance. The abscissa axis of FIG. 6 represents a depth (nm) from the surface of the p-type silicon substrate 11.

In FIG. 6, the solid line 21 represents the concentration distribution of phosphorus that is obtained in such a manner that phosphorus is ion-implanted into the extension region 17 and then it is performed with RTA. Note that the solid line 21 represents the concentration distribution of phosphorus in the extension region 17 formed by means of the existing art.

The solid line 22 represents the concentration distribution of indium that is obtained in such a manner that indium is ion-implanted into the pocket region 15 and then it is performed with RTA.

The solid line 23 represents the concentration distribution of phosphorus in the extension region 17 that has undergone the following processes. The first process is a process in which germanium is ion-implanted into the p-type silicon substrate 11 to form the amorphous region 14. The second process is a process in which indium is ion-implanted into the pocket region 15. The third process is a process in which ions are implanted in such a manner that the concentration peak of carbon that forms the diffusion suppressing region 16 is at the interface of the amorphous region 14. The fourth process is a process in which phosphorus is ion-implanted into the extension region 17 between the amorphous region 14 and the diffusion suppressing region 16. The fifth process is a process in which RTA is performed after phosphorus has been ion-implanted into the extension region 17.

The solid line 24 represents the concentration distribution of carbon that has undergone the following processes. The first process is a process in which germanium is ion-implanted into the amorphous region 14. The second process is a process in which indium is ion-implanted into the pocket region 15. The third process is a process in which ions are implanted in such a manner that the concentration peak of carbon that forms the diffusion suppressing region 16 is at the interface of the amorphous region 14. The fourth process is a process in which RTA is performed after ions have been implanted so that the concentration peak of carbon that serves as the diffusion suppressing substance is at the interface of the amorphous region 14.

The arrow 25 represents the depth of the amorphous region 14.

As shown in FIG. 6, the concentration distribution of phosphorus shown by the solid line 21 according to the existing art, after RTA, appears gentle distribution and not steep at all. On the other hand, it appears that the solid line 23 indicates that phosphorus in the extension region 17 indicates steep concentration distribution within a range that is shallower than the interface between the amorphous region 14 and the crystal in the p-type silicon substrate 11. Furthermore, it appears that the solid line 22 indicates that carbon that serves as the diffusion suppressing substance segregates around the interface between the amorphous region 14 and the crystal in the p-type silicon substrate 11. According to the above, it proves that the concentration distribution of phosphorus shown by the solid line 23 and the concentration distribution of the diffusion suppressing substance shown by the solid line 24 can control diffusion of phosphorus in the extension region 17.

First, owing to the thermal treatment process, carbon, which is a diffusion suppressing substance, having a peak of concentration at the interface of the amorphous region 14, segregates at residual defects (EOR: End of Range) that are generated when the crystal of the amorphous region 14 grows. At this time, when the amorphous region 14 recovers but a thermal load is not sufficient for the diffusion suppressing substance to segregate, segregation occurs at the time when a maximally high-temperature heat is applied finally. On the other hand, owing to the carbon that enters the crystal defects of the p-type silicon substrate 11 at the interface of the amorphous region 14, aggregation of point defects also occurs at the same time. Thus, it becomes a stable state in terms of energy as a whole system, so that carbon that serves as the diffusion suppressing substance segregates at the interface of the amorphous region 14.

The phosphorus that is ion-implanted into the extension region 17 is suppressed to diffuse by the diffusion suppressing region 16 that has segregated at the interface of the amorphous region 14. As a result, the phosphorus that is ion-implanted into the extension region 17 forms steep distribution in the original amorphous region 14.

The configuration and manufacturing method of the re-type MIS transistor 10 according to the first embodiment of this technique are characterized in that the interface between the amorphous region 14 and the crystal is formed on the lower side with respect to the extension region 17, that is, at the second depth that is deeper than the first depth. Thus, as a thermal load that can generate diffusion is applied after the extension region 17 has been formed in the amorphous region 14, a diffusion suppressing substance segregates at the interface between the amorphous region 14 and the crystal. The segregation of a diffusion suppressing substance consumes point defects at the interface, so that diffusion of n-type impurities in the extension region 17 is suppressed. Because diffusion of n-type impurities in the extension region 17 is suppressed, it is possible to obtain a steep distribution of impurity concentration in the extension region 17.

Second Embodiment

In the second embodiment of this technique, FIG. 7A to FIG. 12 are views that specifically illustrate the configuration of a p-type MIS transistor 30 and a method of manufacturing the p-type MIS transistor 30. Note that the MIS transistor means a field-effect transistor. The manufacturing method of the p-type MIS transistor 30 according to the second embodiment is characterized in that the interface between an amorphous region 34 and a crystal is formed on the lower side with respect to an extension region 37, that is, at a second depth that is deeper than a first depth. Thus, as a thermal load that can generate diffusion is applied after the extension region 37 has been formed in the amorphous region 34, a diffusion suppressing substance segregates at the interface between the amorphous region 34 and the crystal. The segregation of a diffusion suppressing substance consumes point defects at the interface, so that diffusion of p-type impurities in the extension region 37 is suppressed. Because diffusion of p-type impurities in the extension region 37 is suppressed, it is possible to make the impurity concentration distribution in the extension region 37 be steep.

FIG. 7A and FIG. 7B are views, each of which shows the configuration of the p-type MIS transistor 30 according to the second embodiment. FIG. 7A is a plan view of the p-type MIS transistor 30. FIG. 7B is a cross-sectional view that is taken along the line X-Y in FIG. 7A.

In FIG. 7A, a gate electrode is denoted by the reference numeral 33, the extension region is denoted by the reference numeral 37, a side wall is denoted by the reference numeral 38, a source region having a high impurity concentration is denoted by the reference numeral 39a, a drain region having a high impurity concentration is denoted by the reference numeral 39b, an active region is denoted by the reference numeral 50, and a device isolation region is denoted by the reference numeral 60.

As shown in FIG. 7A, the device isolation region 60 is provided around the p-type MIS transistor 30. The active region 50 is a rectangular region that is defined by the device isolation region 60. The gate electrode 33 is provided so that its rectangular pattern portion crosses over the middle portion of the active region 50. The side wall 38 is provided around the gate electrode 33. The extension regions 37 are provided in the active region 50 adjacent to the gate electrode 33 in a predetermined width. Note that, as will be shown in FIG. 7B later, an inert substance containing region 34a, a diffusion suppressing region 36 and the extension region 37 are substantially overlapped as viewed from the upper face. The source region 39a having a high impurity concentration and the drain region 39b having a high impurity concentration are provided in a region within the active region 50 except the gate electrode 33 and the extension regions 37 as viewed from the upper face.

In FIG. 7B, an n-type silicon substrate is denoted by the reference numeral 31, a gate insulating film is denoted by the reference numeral 32, the gate electrode is denoted by the reference numeral 33, the inert substance containing region is denoted by the reference numeral 34a, a pocket region is denoted by the reference numeral 35, the diffusion suppressing region is denoted by the reference numeral 36, the extension region is denoted by the reference numeral 37, the side wall is denoted by the reference numeral 38, the source region having a high impurity concentration is denoted by the reference numeral 39a, the drain region having a high impurity concentration is denoted by the reference numeral 39b, a silicide layer is denoted by the reference numeral 40, a source region is denoted by the reference numeral 47a, and a drain region is denoted by the reference numeral 47b. Note that, in FIG. 7B, the same reference numerals are assigned to the same configuration as the configuration described with reference to FIG. 7A.

The gate insulating film 32 is formed on the n-type silicon substrate 31. The gate insulating film 32 has a thickness of about 1 nm to 2 nm, for example.

The gate electrode 33 is formed above the n-type silicon substrate 31 through the gate insulating film 32. The gate electrode 33 has a height of about 100 nm, for example. The gate electrode 33 has a width of about 25 to 90 nm, for example. The gate electrode 33 may be formed of polysilicon.

The source region 47a and the drain region 47b are provided within the n-type silicon substrate 31. The extension regions 37 are respectively part of the source region 47a and part of the drain region 47b. The extension regions 37 each are regions into which impurities that impart a p conductivity type are ion-implanted. The extension regions 37 each are desirably formed from the long side of the rectangular pattern of the gate electrode 33 within a range of, for example, 80 nm and within a range from the surface of the n-type silicon substrate 31 to a first depth, that is, for example, to a depth of 40 nm at the maximum (within a range in which impurity concentration is equal to or more than $1.0 \times 10^{18}$ cm$^{-3}$).

The width to which each extension region 37 is formed is dependent on the width to which the side wall 38 is formed on the n-type silicon substrate 31, which will be described later. This is because the extension regions 37, when the source region 39a having a high impurity concentration and the drain region 39b having a high impurity concentration are formed by ion-implanting impurities, are formed by masking ion implantation of impurities using the gate electrode 33 and the side wall 38. The extension regions 37 are provided to reduce the influence due to spreading of a depletion layer to the channel portion of the source region 47a and the drain region 47b to suppress the short channel effect of the p-type MIS transistor 30. Note that the channel portion in the p-type MIS transistor 30 is formed in the n-type silicon substrate 31 immediately below the gate electrode 33. That is, the channel portion is a region that is located between the source region 47a and the drain region 47b.

The inert substance containing region 34a is a region that contains an inert substance that is equal to or heavier than silicon. The inert substance in the present embodiment is desirably germanium. Note that the inert substance may be silicon, germanium, xenon, or argon. The inert substance containing region 34a, as in the case of the first embodiment, is a region that is crystallized by performing thermal treatment on the amorphous region 34, which will be described later, in which silicon exists in an amorphous state.

The inert substance containing region 34a is formed within the n-type silicon substrate 31 and is arranged adjacent to the long side of the rectangular pattern of the gate electrode 33. The inert substance containing region 34a is provided so as to overlap each of the extension regions 37. Thus, each of the inert substance containing regions 34a is formed from the long side of the rectangular pattern portion of the gate electrode 33 within a range of nm, and is formed to overlap the extension region 37. Each inert substance containing region 34a is formed within a range from the surface of the n-type silicon substrate 31 to a depth of 50 nm at the maximum, which is deeper than the extension region 37 and which is the second depth that is deeper than the first depth.

The width to which each inert substance containing region 34a, as in the case of the first embodiment, is formed is dependent on the width to which the side wall 38 is formed on the n-type silicon substrate 31, which will be described later.

Note that, as will be described later, when p-type ions are implanted into the source region 39a having a high impurity concentration and the drain region 39b having a high impurity concentration, the source region 39a having a high impurity concentration and the drain region 39b having a high impurity concentration also enter an amorphous state as in the case of the inert substance containing region 34a. However, each inert substance containing region 34a in the present embodiment means a region that is formed by ion-implanting an inert substance within the n-type silicon substrate 31 below the side wall 38.

Each of the diffusion suppressing regions 36 is arranged within the n-type silicon substrate 31 and is located adjacent to the long side of the rectangular pattern of the gate electrode 33. Each diffusion suppressing region is provided by ion-implanting a diffusion suppressing substance in order to suppress diffusion of impurities that will be ion-implanted into the corresponding extension region 37. The peak of concentration of the diffusion suppressing substance is formed to coincide with the interface of each amorphous region 34 or is formed to a third depth, which is deeper than the second depth and which is on the lower side with respect to the interface of each amorphous region 34. As shown in FIG. 7B, each diffusion suppressing region 36 is formed within the active region 50 except the gate electrode 33.

Each of the pocket regions 35 is arranged within the n-type silicon substrate 31 and is located adjacent to the long side of the rectangular pattern of the gate electrode 33. Each pocket region 35 is provided below the corresponding extension region 37. Each pocket region 35 is provided in order to suppress the punch-through effect between the source region 47a and the drain region 47b.

The maximum depth to which each pocket region 15, as in the case of the first embodiment, is formed is desirably within a range from the surface of the n-type silicon substrate 31 to, for example, 40 nm at the maximum.

The side wall 38 is formed on the side wall of the gate electrode 33. The side wall 38 may be formed using silicon oxide, which is an insulating material. The width to which the side wall 38, as in the case of the first embodiment, is formed is desirably formed in a thickness of, for example, 10 nm to 80 nm.

The source region 39a has a high impurity concentration and the drain region 39b having a high impurity concentration each are provided from the end portion at which the side wall 38 is formed to a predetermined width on the n-type silicon substrate 31. As shown in FIG. 7A, the source region 39a having a high impurity concentration and the drain region 39b having a high impurity concentration are formed within the active region 50 except the gate electrode 33. The maximum depth to which the source region 39a having a high impurity concentration or the drain region 39b having a high impurity concentration are formed is desirably within a range from the surface of the n-type silicon substrate 31 to, for example, 100 nm.

The silicide layer 40 is provided on the surfaces of the gate electrode 33, the source region 39a having a high impurity concentration and the drain region 39b having a high impurity concentration. The silicide layer 40, as in the case of the first embodiment, is desirably formed to have a thickness of, for example, 5 nm to 30 nm.

FIG. 8A to FIG. 10 are views that illustrate a method of manufacturing the p-type MIS transistor 30 according to the second embodiment.

Figure 8A:
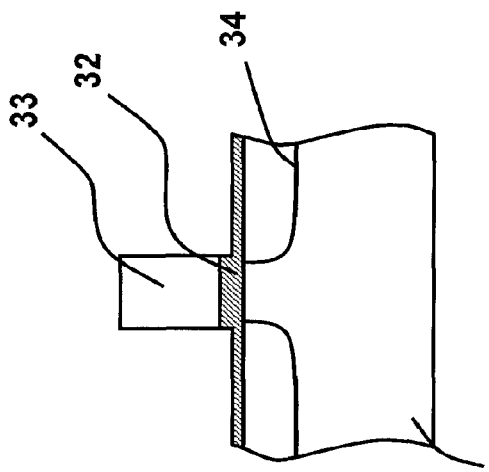
FIGS. 8A to 8D are cross-sectional views that show a method of manufacturing the p-type MIS transistor according to the second embodiment.

FIG. 8A is a view that illustrates a process in which the gate insulating film 32 and the gate electrode 33 are formed.

The gate insulating film 32 is formed on the n-type silicon substrate 31. The n-type silicon substrate 31 has a body of single crystal silicon. The n-type silicon substrate 31 has an n-type conductive impurity concentration of, for example, $1.0 \times 10^{16}$ cm$^{-3}$. The gate insulating film is formed of silicon nitride oxide (SiON), which is formed by, for example, CVD or a combination of thermal oxidation and thermal nitridation.

The gate electrode 33 is formed on the gate insulating film 32. The gate electrode 33 is formed so that a polysilicon film (not shown) is deposited on the gate insulating film 32 to a thickness of about 100 nm, for example, by means of CVD, or the like, and a resist pattern is formed by means of photolithography and, thereafter, a polysilicon film is patterned to be shaped into an electrode by means of anisotropic etching.

Figure 8B:
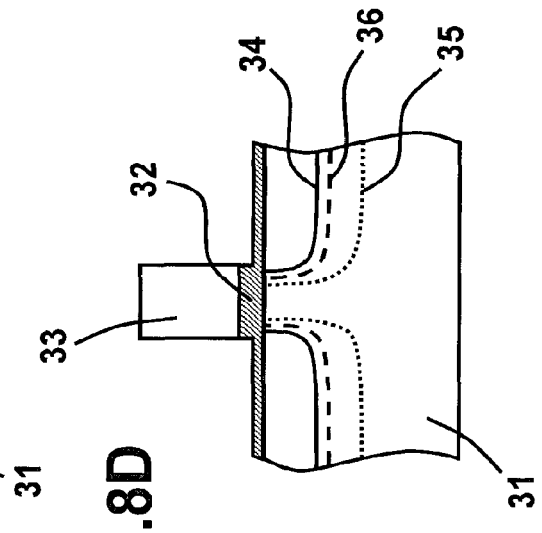

FIG. 8B is a view that illustrates a process in which the amorphous region 34 is formed in the n-type silicon substrate 31 to a fourth depth using the same manner as the manner that is described in FIG. 2A of the first embodiment.

Figure 8C:
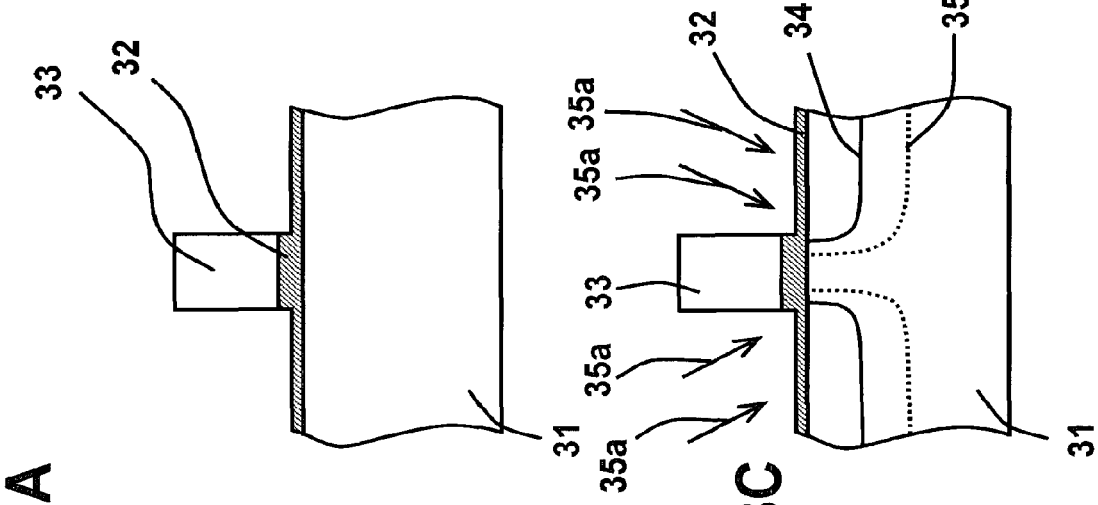

FIG. 8C is a view that illustrates a process in which the pocket region 35 is formed.

Each pocket region 35 is formed so that n-type inert impurities are obliquely ion-implanted into the pocket region 35 of the n-type silicon substrate 31 using the gate electrode 33 as a mask. The oblique ion implantation is desirably performed at an angle of, for example, 0 degrees to 45 degrees with respect to the normal of the semiconductor substrate, as indicated by the arrow 35a. This is because, by setting the angle of oblique ion implantation for 45 degrees at the maximum, the pocket region 35 will be formed on the outer side of the amorphous region 34 in the channel direction.

The n-type conductive impurities may, for example, use antimony. The condition of oblique ion implantation is acceleration energy of 30 keV to 100 keV and a dose amount of $1 \times 10^{12}$/cm$^2$ to $2 \times 10^{13}$/cm$^2$ per one direction.

Note that the n-type conductive impurities that form the pocket region 35 may use arsenic or phosphorus. The condition of implantation of arsenic is acceleration energy of 25 keV to 100 keV and a dose amount of $1 \times 10^{12}$/cm$^2$ to $2 \times 10^{13}$/cm$^2$. The condition of phosphorus implantation is acceleration energy of 15 keV to 70 keV and a dose amount of $10^{12}$/cm$^2$ to $2 \times 10^{13}$/cm$^2$.

Figure 8D:
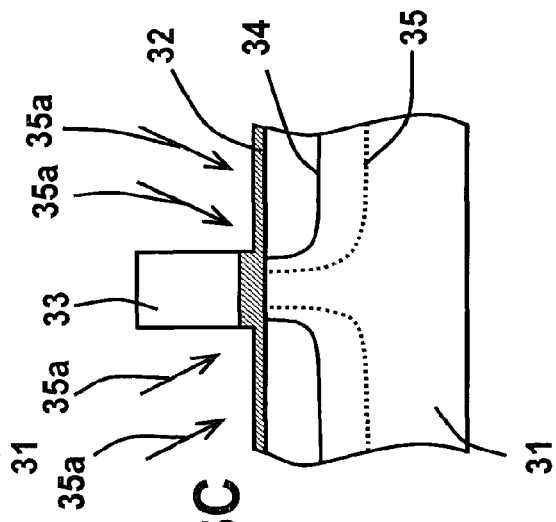

FIG. 8D is a view that illustrates a process in which the diffusion suppressing region 36 that suppresses diffusion of impurities is formed within the n-type silicon substrate 31 to a fifth depth that is deeper than the fourth depth using the same manner as the manner that is described in FIG. 2A of the first embodiment.

Figure 9A:
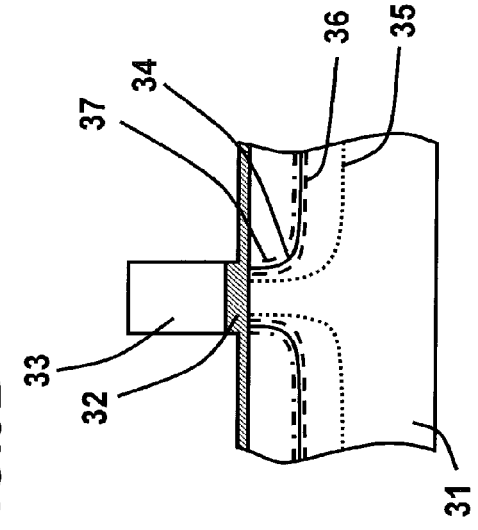
FIGS. 9A to 9D are cross-sectional views that show the method of manufacturing the p-type MIS transistor according to the second embodiment.

FIG. 9A is a view that illustrates a process in which the extension regions 37 are formed within the n-type silicon substrate 31 to a sixth depth that is deeper than the fourth depth.

The extension regions 37 are respectively part of the source region 47a and part of the drain region 47b. Each extension region 37 is formed so that impurities that impart an n conductivity type to the n-type silicon substrate 31 are ion-implanted more shallowly than the amorphous region 34, that is, to the sixth depth that is shallower than the fourth depth. Furthermore, the extension region 37 is formed to be shallower than the amorphous region 34 that was present before a thermal load is applied even when the portion that was the amorphous region 34 disappears by applying a maximally high-temperature thermal load.

The extension region 37 is formed so that ions are implanted into the extension region 37 of the n-type silicon substrate 31 using the gate electrode 33 as a mask. The p-type conductive impurities may, for example, employ boron. The condition of ion implantation of boron in the extension region 37 is acceleration energy of 0.2 keV to 5.0 keV and a dose amount of $1.0\times10^{14}/cm^2$ to $2.0\times10^{15}/cm^2$.

The extension region 37 is formed within each of the amorphous region 34, so that channeling due to ion implantation of boron is suppressed. Because channeling due to ion implantation of boron is suppressed, impurity concentration distribution, when ions of impurities are implanted into the extension region 37, may be formed to be narrow.

Note that the angle at which ions of boron are implanted into the n-type silicon substrate 31 may be set within a range of 0 degrees to 30 degrees. By setting the angle at which ions of boron are implanted for 30 degrees at the maximum, the amount of diffusion in the horizontal direction may be easily controlled. At the same time, the angle at which ions of germanium are implanted to form the amorphous region 34, the angle at which ions of antimony are implanted to form the pocket region 35 or the angle at which ions of carbon are implanted to form the diffusion suppressing region 36 may be selected. This is because the extension region 37 is sufficiently shallow and therefore is formed sufficiently inside the amorphous region even with a large angle.

Note that the extension region 37 may be formed using boron fluoride or cluster boron instead of boron. The condition of ion implantation of boron fluoride in the extension region 37 is acceleration energy of 1 keV to 5 keV and a dose amount of $1.0\times10^{14}/cm^2$ to $2.0\times10^{15}/cm^2$.

Figure 9B:
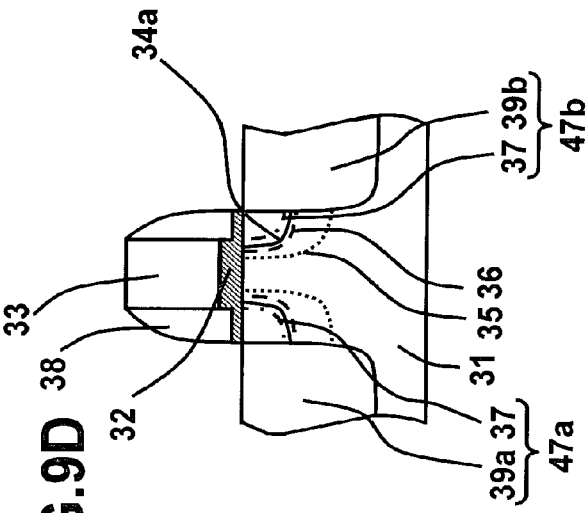

FIG. 9B is a view that illustrates a process in which the n-type silicon substrate 31 is performed with thermal treatment so that a diffusion suppressing substance segregates at the interface of the amorphous region 34. The thermal treatment process is performed to activate impurities of the pocket region 35 and impurities of the extension region 37.

The condition used in the thermal treatment process is desirably performed by means of RTA process for almost 0 seconds, except time to increase or decrease temperature, at a temperature of 900° C. to 1025° C. (it may be 10 seconds or below at a temperature of 900° C. to 1100° C.). The thermal treatment process is, for example, performed in an inert atmosphere, such as nitrogen. Note that the thermal treatment process may be performed by means of flash lamp or laser annealing.

Owing to the thermal treatment process, concentration distribution of carbon, which is a diffusion suppressing substance, changes from a state immediately after implantation. First, owing to the thermal treatment process, carbon, which is a diffusion suppressing substance, having a peak of concentration at the interface of the amorphous region 34, segregates at residual defects (EOR: End of Range) that are generated when the crystal of the amorphous region 34 grows. At this time, when the amorphous region recovers but a thermal load is not sufficient for the diffusion suppressing substance to segregate, segregation occurs at the time when a maximally high-temperature heat is applied finally.

Owing to the carbon that enters the crystal defects of the n-type silicon substrate 31 at the interface of the amorphous region 34, aggregation of point defects also occurs at the same time. Thus, it becomes a stable state in terms of energy as a whole system and, hence, diffusion hardly occurs in the thermal treatment process. As a result, the carbon, which is a diffusion suppressing substance, segregates at the interface of the amorphous region 34.

The boron that is ion-implanted into the extension region 37 segregates at the interface of the amorphous region 34 to thereby facilitate consumption of point defects that cause an increase in rate of diffusion, so that diffusion is suppressed. As a result, the boron that is ion-implanted into the extension region 37 forms steep distribution in the original amorphous region 34.

Note that, because the amorphous region 34 is crystallized through the present thermal treatment process, the interface between the amorphous region 34 and the n-type silicon substrate 31 disappears. Note that the original amorphous region 34 becomes an inert substance containing region 34a shown in FIG. 7B.

Figure 9C:
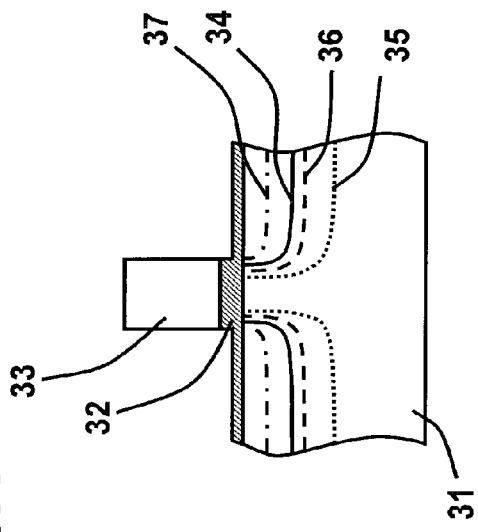

FIG. 9C is a view that illustrates a process in which the side wall 18 is formed on the side wall of the gate electrode 33 using the same manner as the manner that is described in FIG. 3C of the first embodiment.

Figure 9D:
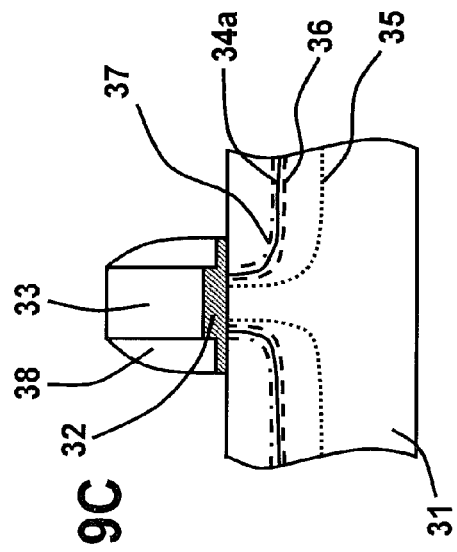

FIG. 9D is a view that illustrates a process in which the source region 39a has a high impurity concentration and the drain region 39b having a high impurity concentration is formed.

As shown in FIG. 9D, the source region 39a having a high impurity concentration and the drain region 39b having a high impurity concentration are respectively formed in such a manner that ions of p-type conductive impurities are implanted into the source region 39a having a high impurity concentration and the drain region 39b having a high impurity concentration of the n-type silicon substrate 31 using the gate electrode 33 and the side wall 38 as a mask. The p-type conductive impurities may, for example, employ boron. The condition of ion implantation of boron in the source region 39a having a high impurity concentration and the drain region 39b having a high impurity concentration is an acceleration energy of 1.0 keV to 5.0 keV and a dose amount of $2.0\times10^{15}/cm^2$ to $1.0\times10^{16}/cm^2$. Note that the source region 39a having a high impurity concentration and the drain region 39b having a high impurity concentration may be formed by using boron fluoride ($BF_2$, BF) or cluster boron instead of boron.

After that, various ion-implanted impurities may be activated by means of annealing for about 10 seconds at a temperature of 1000° C.

Figure 10:
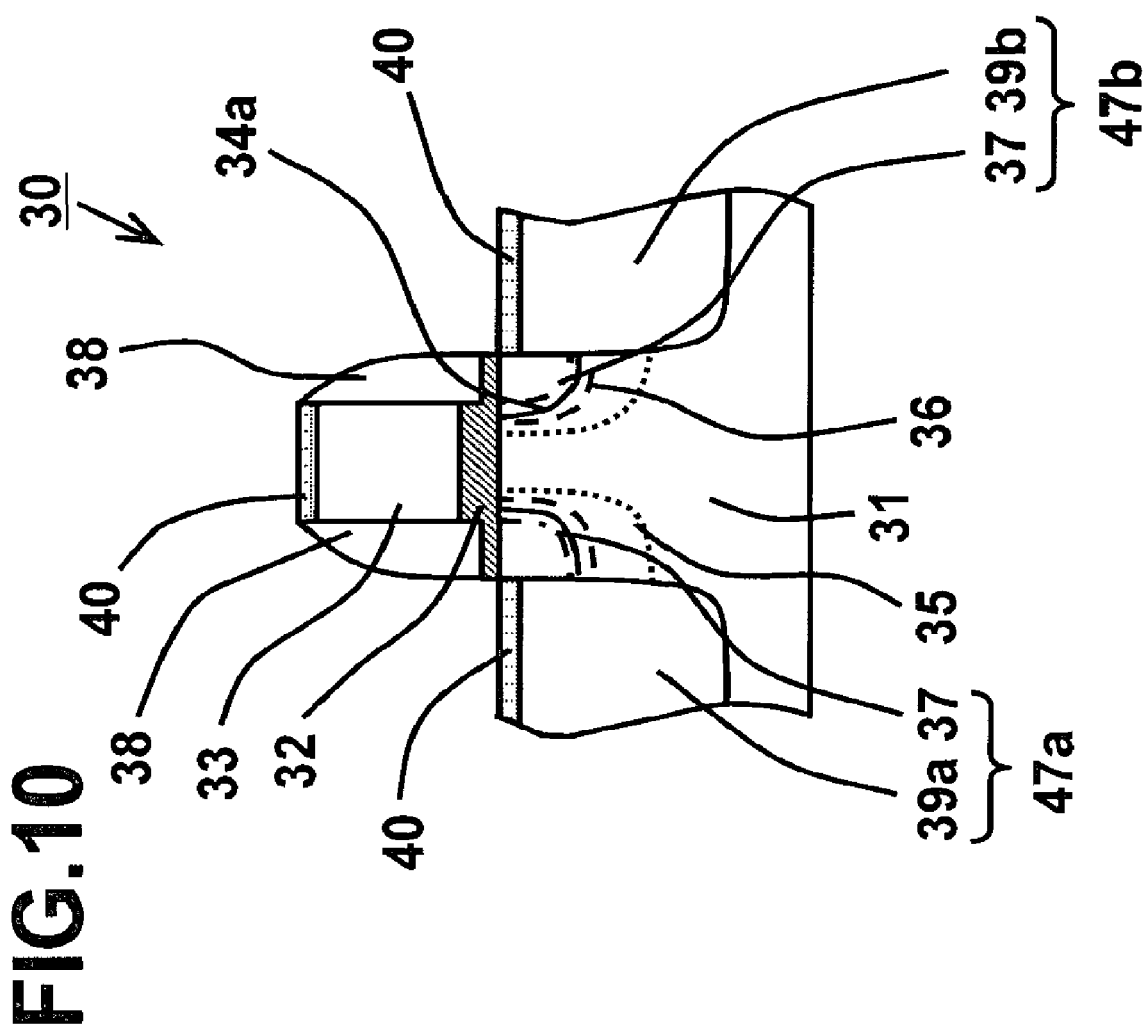
FIG. 10 is a cross-sectional view that shows the method of manufacturing the p-type MIS transistor according to the second embodiment.

FIG. 10 is a view that illustrates a process in which the silicide layer 20 is formed using the same manner as the manner that is described in FIG. 4 of the first embodiment.

Then, the p-type MIS transistor 30 is completed through processes, such as formation of an interlayer insulating film (not shown), formation of a contact hole (not shown), and formation of wiring (not shown).

Note that, in the present embodiment, the case in which, after the gate electrode has been formed, a pair of impurity diffusion regions, which serve as the source region and the drain region, are formed is exemplified. However, it may be conceivable that the order of the above formation may be modified where appropriate.

The present embodiment exemplifies the case in which the processes proceed in the order of the process of ion implantation of an inert substance for forming the amorphous region 34, the process of ion implantation for forming the pocket region 35, the process of ion implantation of carbon, which serves as a diffusion suppressing substance, and the process of forming the extension region 37; however, the order of these processes may be selected.

However, depending on the order of these processes, concentration distribution of ion implantation of the pocket region 35 and the extension region 37 is influenced because of amorphization due to formation of the amorphous region 34, so that an optimum design for them is necessary.

Figure 11A:
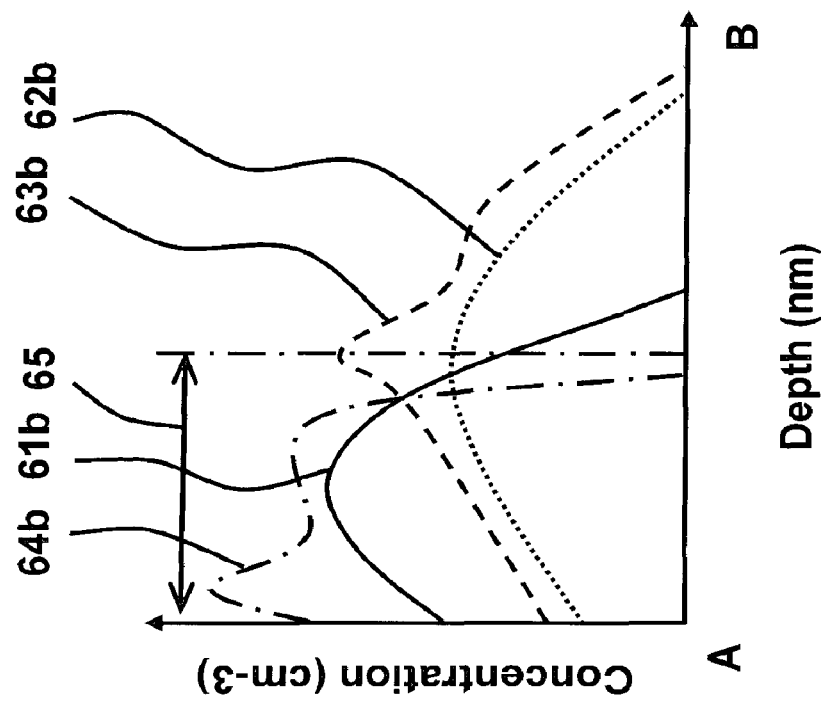
FIGS. 11A and 11B are schematic views, each of which shows the concentration distribution of each ion implantation according to the p-type MIS transistor of the second embodiment.
Figure 11B:
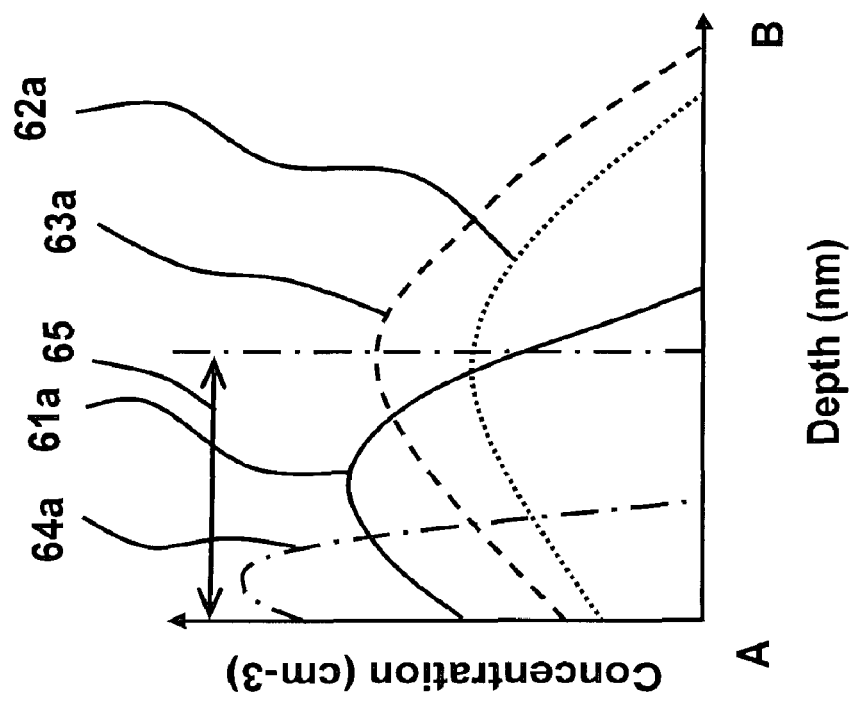

FIG. 11A and FIG. 11B are schematic views, each of which shows the concentration distribution of each ion implantation according to the p-type MIS transistor 30 of the second embodiment. The ordinate axis of each of FIG. 11A and FIG. 11B represents a concentration ($cm^{-3}$) of each implanted substance. The abscissa axis of each of FIG. 11A and FIG. 11B represents a depth (nm) from the surface of the n-type silicon substrate 31.

FIG. 11A is a view that illustrates the concentration distribution of each ion implantation in the cross-section, taken along the line A-B in FIG. 7B, before the n-type silicon substrate 31 is performed with thermal treatment so that the diffusion suppressing substance segregates at the interface of the amorphous region 34. The reference numeral 61a denotes the concentration distribution of germanium contained in the amorphous region 34. The reference numeral 62a denotes the concentration distribution of antimony contained in the pocket region 35. The reference numeral 63a denotes the concentration distribution of carbon contained in the diffusion suppressing region 36. The reference numeral 64a denotes the concentration distribution of boron contained in the extension region 37. The arrow 65 denotes a depth from the n-type silicon substrate 31 to which crystallinity of the n-type silicon substrate 31 has broken when germanium is ion-implanted into the amorphous region 34.

As shown in FIG. 11A, the concentration peak 62a of antimony in the pocket region 35 and the concentration peak of carbon in the diffusion suppressing region 36 are positioned at the interface between the amorphous region 34 and the crystal in the n-type silicon substrate 31.

FIG. 11B is a view that illustrates the concentration distribution of each ion implantation in the cross-section, taken along the line A-B in FIG. 7B, after the n-type silicon substrate 31 has been performed with thermal treatment so that the diffusion suppressing substance segregates at the interface of the amorphous region 34. The reference numeral 61b denotes the concentration distribution of germanium contained in the amorphous region 34. The reference numeral 62b denotes the concentration distribution of antimony contained in the pocket region 35. The reference numeral 63b denotes the concentration distribution of carbon contained in the diffusion suppressing region 36. The reference numeral 64b denotes the concentration distribution of boron contained in the extension region 37. The arrow 65 denotes a depth from the n-type silicon substrate 31 to which crystallinity of the n-type silicon substrate 31 has broken when germanium is ion-implanted into the amorphous region 34.

As shown in FIG. 11B, it appears that the concentration peak of carbon in the diffusion suppressing region 36 is steep at the interface between the amorphous region 34 and the crystal in the n-type silicon substrate 31. Next, it appears that the concentration distribution of boron contained in the extension region 37 is steep in the amorphous region 34.

Here, the concentration distribution according to SIMS of each implantation described above in the present embodiment will be described.

Figure 12:
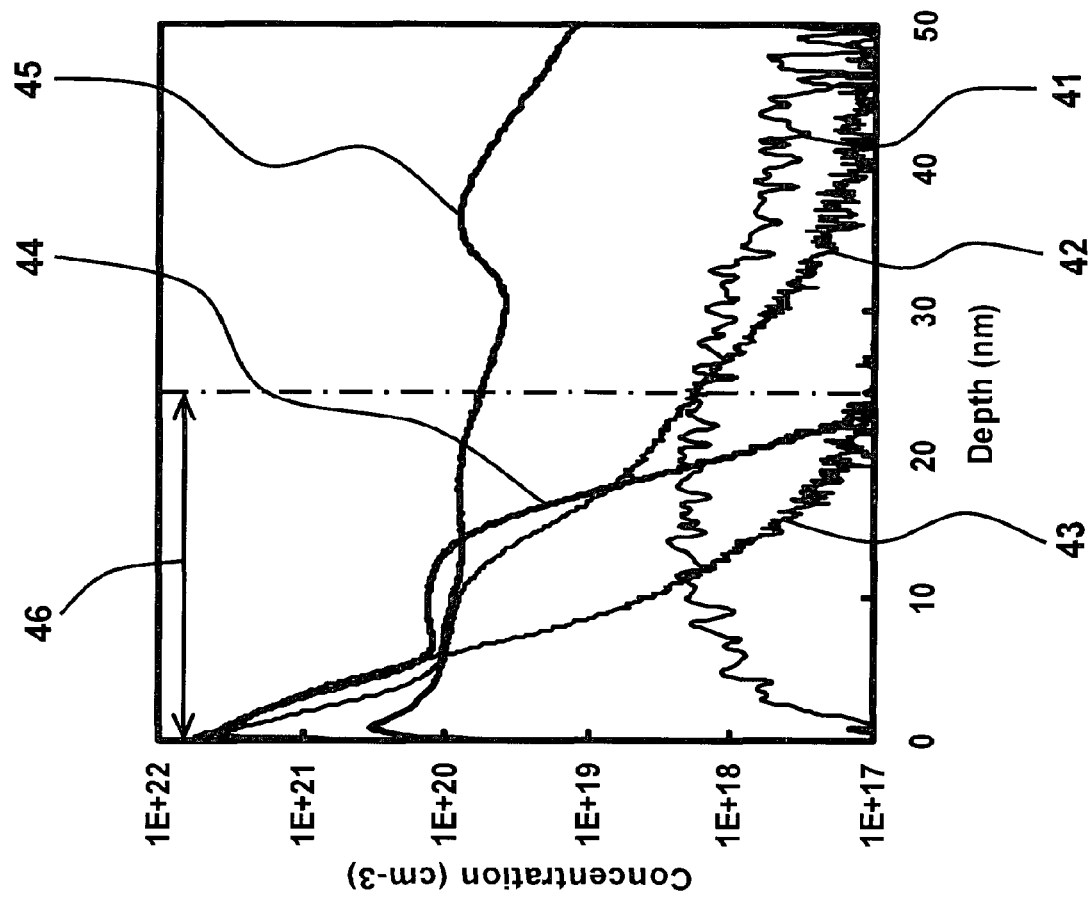
FIG. 12 is a view that shows the concentration distribution of each ion implantation, measured by SIMS, according to the p-type MIS transistor of the second embodiment.

FIG. 12 is a characteristic view that shows the concentration distribution according to SIMS of each implantation described in the present embodiment. The ordinate axis of FIG. 12 represents a concentration ($cm^{-3}$) of each implanted substance. The abscissa axis of FIG. 12 represents a depth (nm) from the surface of the n-type silicon substrate 31.

In FIG. 12, the solid line 41 represents the concentration distribution of boron obtained in such a manner that antimony is ion-implanted into the pocket region 35, boron is ion-implanted into the extension region 37 and then it is performed with RTA. Note that the solid line 41 represents the concentration distribution of boron in the extension region 37 formed by means of the existing art.

The solid line 41 represents the concentration distribution of antimony that is obtained in such a manner that antimony is ion-implanted into the pocket region 35 and then it is performed with RTA.

The solid line 43 represents the concentration distribution of boron that is obtained in such a manner that germanium is ion-implanted into the amorphous region 34, boron is ion-implanted into the extension region 37 so as to be superimposed on the amorphous region 34.

The solid line 44 represents the concentration distribution of boron in the extension region 37 that has undergone the following processes. The first process is a process in which germanium is ion-implanted into the n-type silicon substrate 31 to form the amorphous region 34. The second process is a process in which antimony is ion-implanted into the pocket region 35. The third process is a process in which ions are implanted in such a manner that the concentration peak of carbon that forms the diffusion suppressing region 36 is at the interface of the amorphous region 34. The fourth process is a process in which boron is ion-implanted into the extension region 37 between the amorphous region 34 and the diffusion suppressing region 36. The fifth process is a process in which RTA is performed after boron has been ion-implanted into the extension region 37.

The solid line 45 represents the concentration distribution of carbon that has undergone the following processes. The first process is a process in which germanium is ion-implanted into the amorphous region 34. The second process is a process in which antimony is ion-implanted into the pocket region 35. The third process is a process in which ions are implanted in such a manner that the concentration peak of carbon that serves as the diffusion suppressing substance is at the interface of the amorphous region 34. The fourth process shows the concentration distribution of carbon that is obtained by performing RTA after ions have been implanted so that the concentration peak of carbon that serves as the diffusion suppressing substance is at the interface of the amorphous region 34.

The arrow 46 represents the depth of the amorphous region 34.

As shown in FIG. 12, the concentration distribution of boron shown by the solid line 42 according to the existing art, after RTA, appears gentle distribution and not steep at all. On the other hand, the solid line 43 represents the concentration distribution of boron in the extension region 37 immediately after implantation. The solid line 43 shows that boron is present within a range that is shallower than the interface between the amorphous region 34 and the crystal in the n-type silicon substrate 31. The solid line 44 represents the concentration distribution of boron in the extension region 37 after a thermal load has been applied. The solid line 44 shows that boron is present within a range that is shallower than the interface between the amorphous region 34 and the crystal in the n-type silicon substrate 31 and has a steep concentration distribution.

Furthermore, it appears that the solid line 45 indicates that carbon that serves as the diffusion suppressing substance segregates around the interface between the amorphous region 34 and the crystal in the n-type silicon substrate 31. According to the above, it proves that the concentration distribution of boron shown by the solid line 44 and the concentration distribution of the diffusion suppressing substance shown by the solid line 45 can control diffusion of boron in the extension region 37.

First, owing to the thermal treatment process, carbon, which is a diffusion suppressing substance, having a peak of concentration at the interface of the amorphous region 34, segregates at residual defects (EOR: End of Range) that are generated when the crystal of the amorphous region 34 grows. At this time, when the amorphous region 34 recovers but a thermal load is not sufficient for the diffusion suppressing substance to segregate, segregation occurs at the time when a maximally high-temperature heat is applied finally. On the other hand, owing to the carbon that enters the crystal defects of the n-type silicon substrate 31 at the interface of the amorphous region 34, aggregation of point defects also occurs at the same time. Thus, it becomes a stable state in terms of energy as a whole system, so that, as a result, carbon that serves as the diffusion suppressing substance segregates at the interface of the amorphous region 34.

The boron that is ion-implanted into the extension region 37 is suppressed to diffuse by the diffusion suppressing region 36 that has segregated at the interface of the amorphous region 34. As a result, the boron that is ion-implanted into the extension region 37 forms steep distribution in the original amorphous region 34.

The configuration and manufacturing method of the p-type MIS transistor 30 according to the second embodiment of this technique are characterized in that the interface between the amorphous region 34 and the crystal is formed on the lower side with respect to the extension region 37, that is, at the second depth that is deeper than the first depth. Thus, as a thermal load that can generate diffusion is applied after the extension region 37 has been formed in the amorphous region 34, a diffusion suppressing substance segregates at the interface between the amorphous region 34 and the crystal. The segregation of a diffusion suppressing substance consumes point defects at the interface, so that diffusion of p-type impurities in the extension region 37 is suppressed. Because diffusion of p-type impurities in the extension region 37 is suppressed, it is possible to obtain a steep distribution of impurity concentration in the extension region 37.

What is claimed is:

1. A semiconductor device comprising:
   a semiconductor substrate;
   a gate insulating film over the semiconductor substrate;
   a gate electrode formed over the gate insulating film;
   an impurity diffusion region formed in an area of the semiconductor substrate adjacent to the gate electrode to a first depth to the semiconductor substrate, the impurity diffusion region containing an impurity;
   an inert substance containing region formed in the area of the semiconductor substrate to a second depth deeper than the first depth, the inert substance containing region containing an inert substance; and
   a diffusion suppressing region formed in the area of the semiconductor substrate to a third depth deeper than the second depth, the diffusion suppressing region containing a diffusion suppressing substance suppressing diffusion of the impurity.

2. The semiconductor device according to claim 1, wherein the semiconductor substrate comprises a body of single crystal silicon and the inert substance is a substance heavier than silicon.

3. The semiconductor device according to claim 1, wherein the inert substance is germanium.

4. The semiconductor device according to claim 1, wherein the diffusion suppressing substance is carbon.

5. The semiconductor device according to claim 1, wherein the impurity is at least one of phosphorous, arsenic, boron, boron fluoride or cluster boron.

* * * * *